United States Patent
Petrov

(10) Patent No.: US 9,240,866 B2
(45) Date of Patent: Jan. 19, 2016

(54) INTERLEAVING METHOD AND DEINTERLEAVING METHOD

(71) Applicant: Panasonic Corporation, Osaka (JP)

(72) Inventor: Mihail Petrov, Bavaria (DE)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/584,224

(22) Filed: Dec. 29, 2014

(65) Prior Publication Data

US 2015/0146813 A1 May 28, 2015

Related U.S. Application Data

(62) Division of application No. 14/130,381, filed as application No. PCT/JP2012/004662 on Jul. 23, 2012, now Pat. No. 8,953,703.

(30) Foreign Application Priority Data

Jul. 25, 2011 (EP) .................................... 11006087

(51) Int. Cl.
*H04B 7/02* (2006.01)
*H04L 1/00* (2006.01)
(Continued)

(52) U.S. Cl.
CPC ........... *H04L 1/0071* (2013.01); *H03M 13/116* (2013.01); *H03M 13/1168* (2013.01);
(Continued)

(58) Field of Classification Search
CPC ............ H03M 13/116; H03M 13/255; H03M 13/1165; H03M 13/2707; H03M 13/27; H03M 13/271; H03M 13/2778; H03M 13/1168; H03M 13/1188; H03M 13/356; H04L 1/0071; H04L 1/0041; H04L 1/0057; H04L 1/0643; H04L 1/0058; H04B 7/0697; H04B 7/08
USPC .................... 375/260, 267; 714/752, 755, 786
See application file for complete search history.

(56) References Cited

U.S. PATENT DOCUMENTS 7,668,248 B2 * 2/2010 Hocevar ............ H03M 13/1185
375/260
9,130,814 B2 * 9/2015 Petrov ...................... H04L 27/34
1/1

(Continued)

FOREIGN PATENT DOCUMENTS

| EP | 2 204 911 | 7/2010 |
| EP | 2 254 249 | 11/2010 |
| EP | 2 254 250 | 11/2010 |

OTHER PUBLICATIONS

International Search Report issued Nov. 13, 2012 in International (PCT) Application No. PCT/JP2012/004662.
(Continued)

*Primary Examiner* — Khanh C Tran
(74) *Attorney, Agent, or Firm* — Wenderoth, Lind & Ponack, L.L.P.

(57) ABSTRACT

Bit permutation to bits of a codeword is performed such that: at least one spatial-multiplexing block is made up of bits from B/2 different cyclic-blocks; each constellation word of the at least one spatial-multiplexing block is made up of bits from $B_t/2$ different cyclic blocks, $B_t$ being the number of bits of the constellation word; and each of the bit pairs of the constellation word is made up of bits from a common one of the $B_t/2$ different cyclic blocks.

12 Claims, 19 Drawing Sheets

(51) Int. Cl.

| | |
|---|---|
| *H03M 13/11* | (2006.01) |
| *H03M 13/27* | (2006.01) |
| *H03M 13/35* | (2006.01) |
| *H04L 1/06* | (2006.01) |
| *H04L 25/02* | (2006.01) |
| *H04L 25/03* | (2006.01) |
| *H04B 7/06* | (2006.01) |
| *H04B 7/08* | (2006.01) |
| *H04L 27/34* | (2006.01) |

(52) U.S. Cl.
CPC ...... *H03M13/1188* (2013.01); *H03M 13/2707* (2013.01); *H03M 13/356* (2013.01); *H04B 7/0697* (2013.01); *H04B 7/08* (2013.01); *H04L 1/0057* (2013.01); *H04L 1/0058* (2013.01); *H04L 1/0643* (2013.01); *H04L 25/02* (2013.01); *H04L 25/03* (2013.01); *H04L 27/345* (2013.01)

(56) References Cited

U.S. PATENT DOCUMENTS

| | | | |
|---|---|---|---|
| 2009/0125780 A1 | 5/2009 | Taylor et al. | |
| 2010/0257426 A1 | 10/2010 | Yokokawa et al. | |
| 2010/0275101 A1 | 10/2010 | Yokokawa et al. | |
| 2010/0281329 A1 | 11/2010 | Yokokawa et al. | |
| 2010/0325512 A1 | 12/2010 | Yokokawa et al. | |
| 2013/0124938 A1* | 5/2013 | Yang | H03M 13/116 714/752 |
| 2014/0119474 A1 | 5/2014 | Petrov | |
| 2014/0126674 A1* | 5/2014 | Petrov | H03M 13/1165 375/340 |
| 2014/0129895 A1* | 5/2014 | Petrov | H03M 13/1142 714/752 |
| 2014/0241476 A1 | 8/2014 | Murakami et al. | |
| 2015/0010103 A1* | 1/2015 | Murakami | H04B 7/0413 375/267 |
| 2015/0188734 A1* | 7/2015 | Petrov | H03M 13/116 375/260 |

OTHER PUBLICATIONS

Mingxi Wang, "WiMAX Physical Layer: Specifications Overview and Performance Evaluation" Consumer Communications and Networking Conference (CCNC), 2011 IEEE, IEEE, Jan. 9, 2011, pp. 10-12.

Jianhua Zhang et al., "Design and Implementation of Time Division-Fourth Generation (TD-4G) Gigabit Speed Wireless Communication System", Communications and Networking in China (CHINACOM), 2010 5th International ICST Conference on, IEEE, Piscataway, NJ, USA, Aug. 25, 2010, pp. 1-5.

Song-Nam Hong et al., "Quasi-Cyclic Low-Density Parity-Check Codes for Space-Time Bit-Interleaved Coded Modulation", IEEE Communications Letters, IEEE Service Center, Piscataway, NJ, US, vol. 12, No. 10, Oct. 1, 2008, pp. 767-769.

Digital Video Broadcasting (DVB); Frame structure channel coding and modulation for a second generation digital terrestrial television broadcasting system (DVB-T2), ETSI EN 302 755 V1.2.1 (Feb. 2011) (DVB-T2 standards).

Digital Video Broadcasting (DVB); Second generation framing structure, channel coding and modulation systems for Broadcasting, Interactive Services, News Gathering and other broadband satellite applications (DVB-S2), ETSI EN 302 307 V1.2.1 (Aug. 2009).

Digital Video Broadcasting (DVB); Frame structure channel coding and modulation for a second generation digital transmission system for cable systems (DVB-C2), Final draft ETSI EN 302 769 V1.2.1 (Dec. 2010).

Written Opinion of the International Searching Authority issued Nov. 13, 2012 in International (PCT) Application No. PCT/JP2012/004662.

* cited by examiner

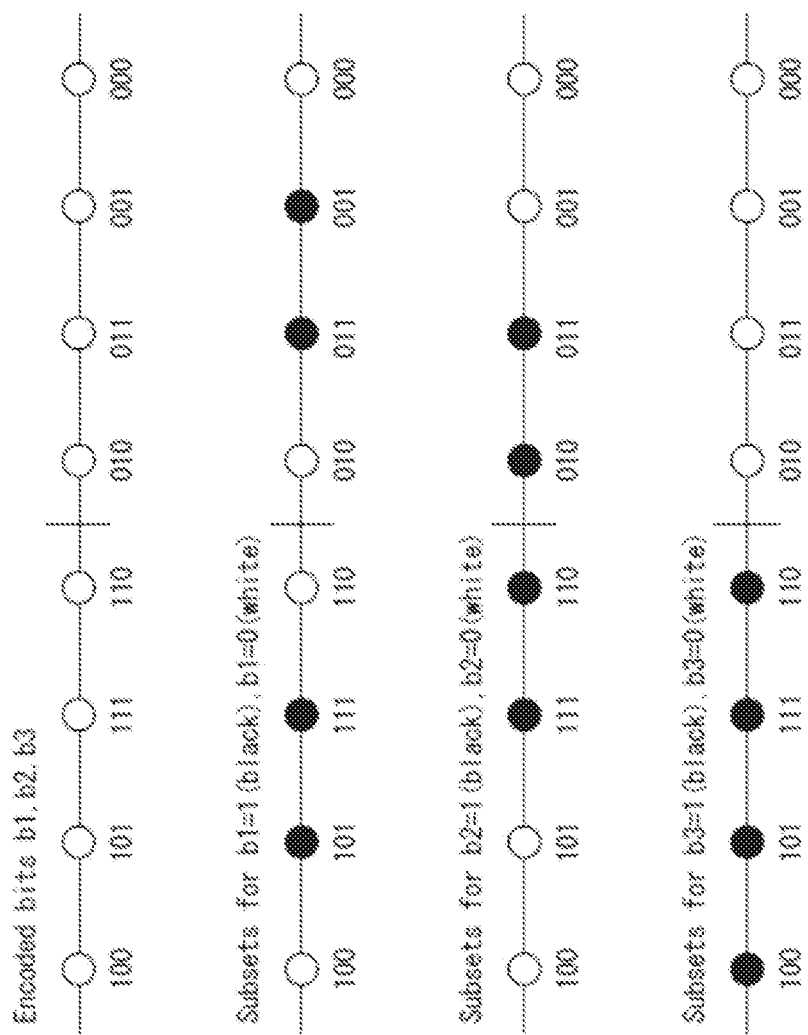

FIG.6A

| | | | | | | | | | | | | | | |
|---|---|---|---|---|---|---|---|---|---|---|---|---|---|---|
| $b_{1,Re}$ | $b_{1,Re}$ | | | | | | | | | | | | | |
| $b_{1,Im}$ | $b_{1,Im}$ | | | | | | | | | | | | | |
| $QB_1$ | $QB_2$ | $QB_3$ | $QB_4$ | $QB_5$ | $QB_6$ | $QB_7$ | $QB_8$ | $QB_9$ | $QB_{10}$ | $QB_{11}$ | $QB_{12}$ | $QB_{13}$ | $QB_{14}$ | $QB_{15}$ |

Tx1, Tx2 (Section 1); Tx1, Tx2 (Section 2); Tx1, Tx2 (Section 3); Tx1, Tx2 (Section 4); Tx1, Tx2 (Section 5); Tx1, Tx2 (Section 6); Tx1, Tx2 (Section 7)

FIG.6B

| | | | | | | | | | | | | | | |
|---|---|---|---|---|---|---|---|---|---|---|---|---|---|---|
| $b_{1,Re}$ | $b_{2,Re}$ | $b_{1,Re}$ | | | | | | | | | | | | |
| $b_{1,Im}$ | $b_{2,Im}$ | $b_{1,Im}$ | | | | | | | | | | | | |
| $QB_1$ | $QB_2$ | $QB_3$ | $QB_4$ | $QB_5$ | $QB_6$ | $QB_7$ | $QB_8$ | $QB_9$ | $QB_{10}$ | $QB_{11}$ | $QB_{12}$ | $QB_{13}$ | $QB_{14}$ | $QB_{15}$ |

Tx1, Tx2 (Section 1); Tx1, Tx2 (Section 2); Tx1, Tx2 (Section 3); Tx1, Tx2 (Section 4); Tx1, Tx2 (Section 5)

FIG.6D

| | Tx1 | | | | Tx2 | | | Tx1 | | | Tx2 | | | Tx1 | | | Tx2 | | |
|---|---|---|---|---|---|---|---|---|---|---|---|---|---|---|---|---|---|---|---|
| | Section 1 | | | | | | | Section 2 | | | | | | Section 3 | | | | | |
| | | | | | | | | | | | | | | | | | | | |
| | | | | | | | | | | | | | | | | | | | |
| | | | | | | | | | | | | | | | | | | | |
| | | | | | | | | | | | | | | | | | | | |
| | $b_{1,Im}$ | $b_{2,Im}$ | $b_{3,Im}$ | $b_{1,Im}$ | $b_{2,Im}$ | | | | | | | | | | | | | | |
| | $b_{1,Re}$ | $b_{2,Re}$ | $b_{3,Re}$ | $b_{1,Re}$ | $b_{2,Re}$ | | | | | | | | | | | | | | |
| | $QB_1$ | $QB_2$ | $QB_3$ | $QB_4$ | $QB_5$ | $QB_6$ | $QB_7$ | $QB_8$ | $QB_9$ | $QB_{10}$ | $QB_{11}$ | $QB_{12}$ | $QB_{13}$ | $QB_{14}$ | $QB_{15}$ |

FIG.6C

| | Tx1 | | Tx2 | | Tx1 | | Tx2 | | Tx1 | | Tx2 | |
|---|---|---|---|---|---|---|---|---|---|---|---|---|
| | Section 1 | | | | Section 2 | | | | Section 3 | | | |
| $b_{1,Im}$ | $b_{2,Im}$ | $b_{1,Im}$ | $b_{2,Im}$ | | | | | | | | | |
| $b_{1,Re}$ | $b_{2,Re}$ | $b_{1,Re}$ | $b_{2,Re}$ | | | | | | | | | |
| $QB_1$ | $QB_2$ | $QB_3$ | $QB_4$ | $QB_5$ | $QB_6$ | $QB_7$ | $QB_8$ | $QB_9$ | $QB_{10}$ | $QB_{11}$ | $QB_{12}$ | $QB_{13}$ | $QB_{14}$ | $QB_{15}$ |

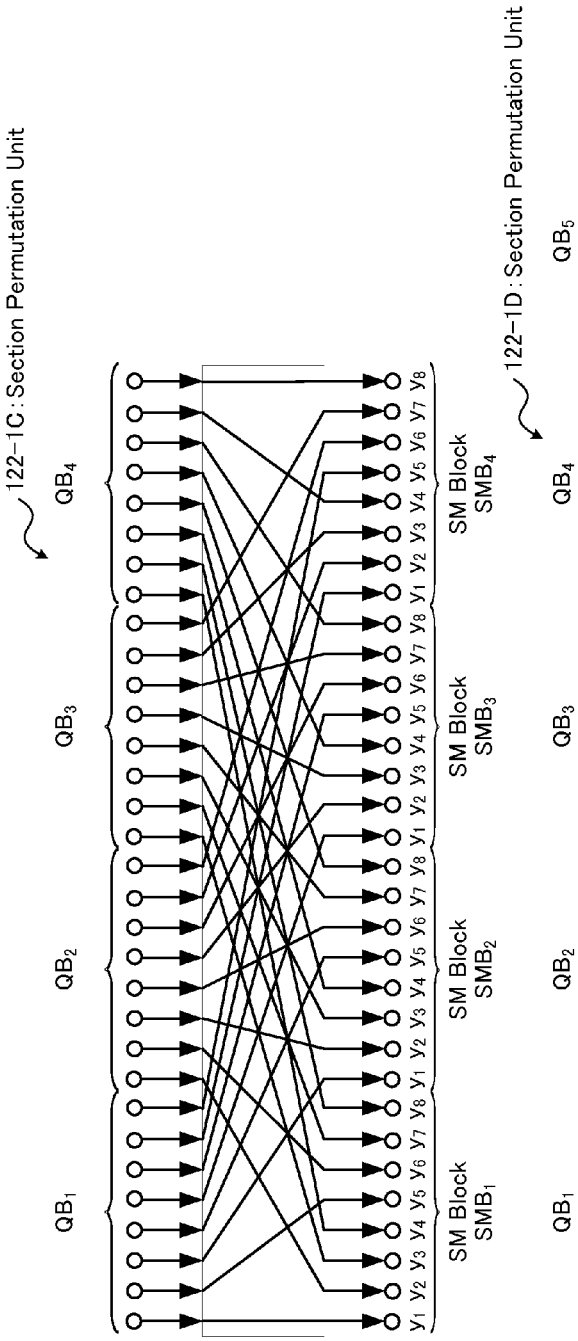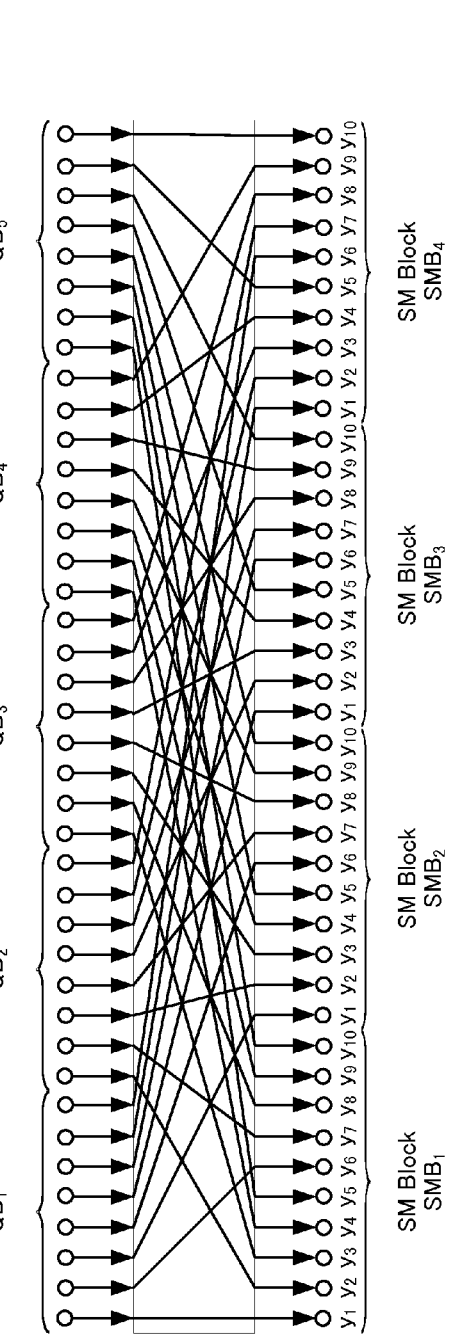
FIG.11C
FIG.11D

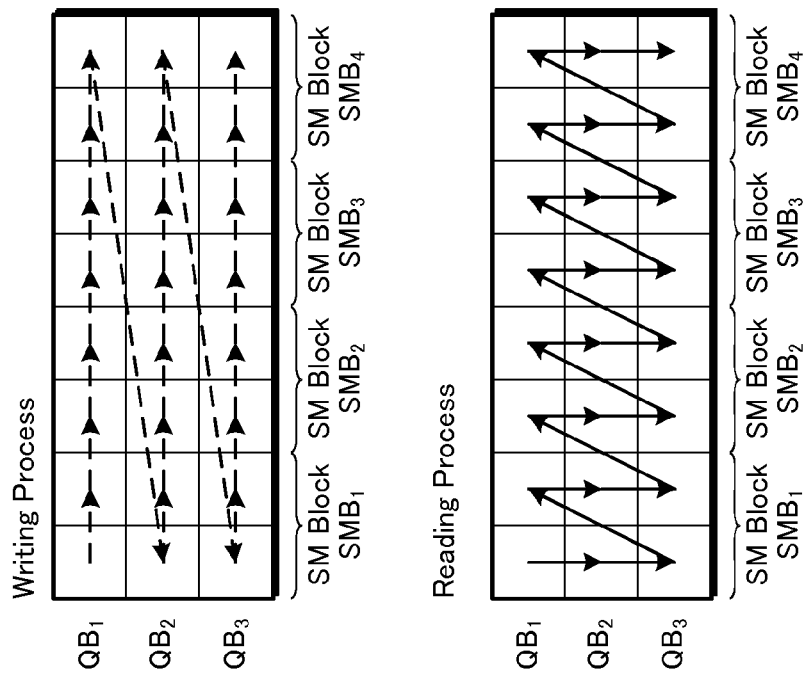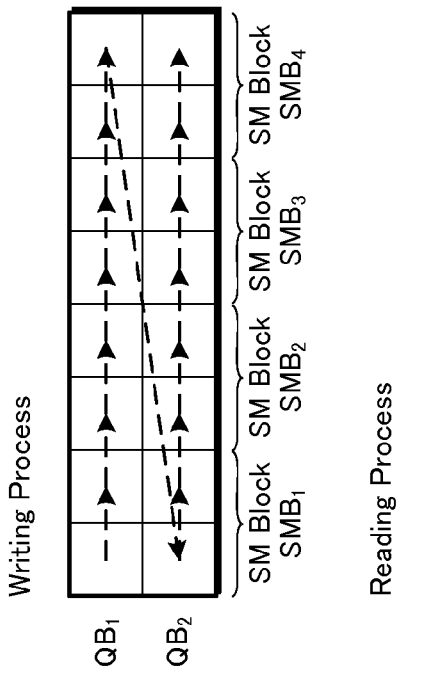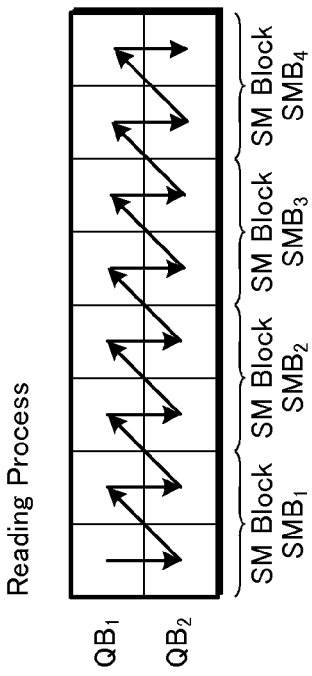
FIG.12B
FIG.12A

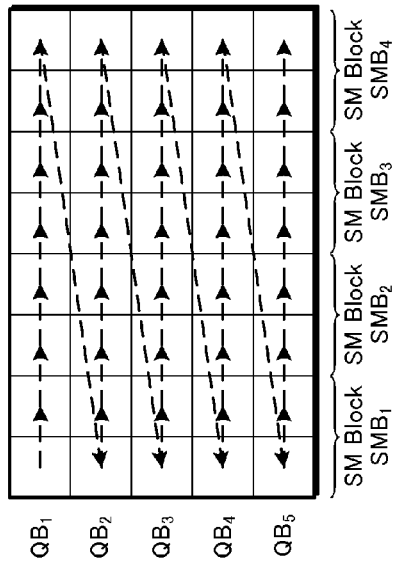
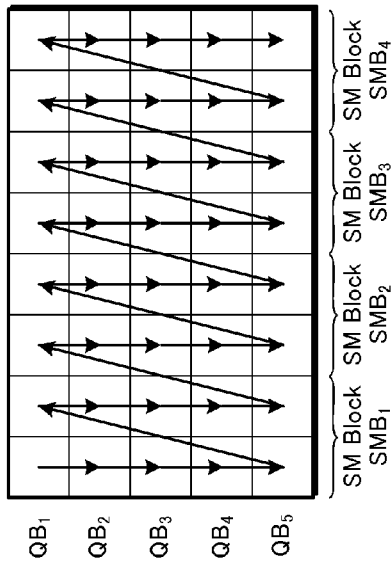
FIG.12C
FIG.12D
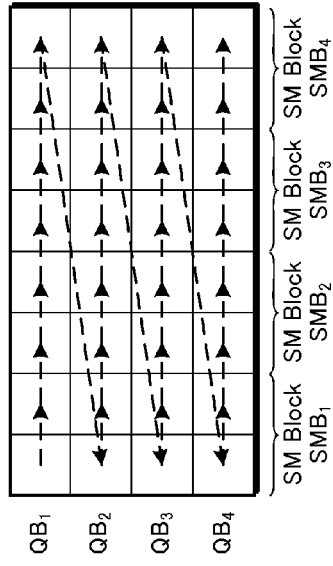
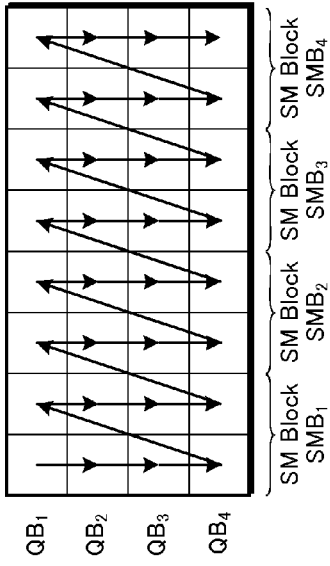

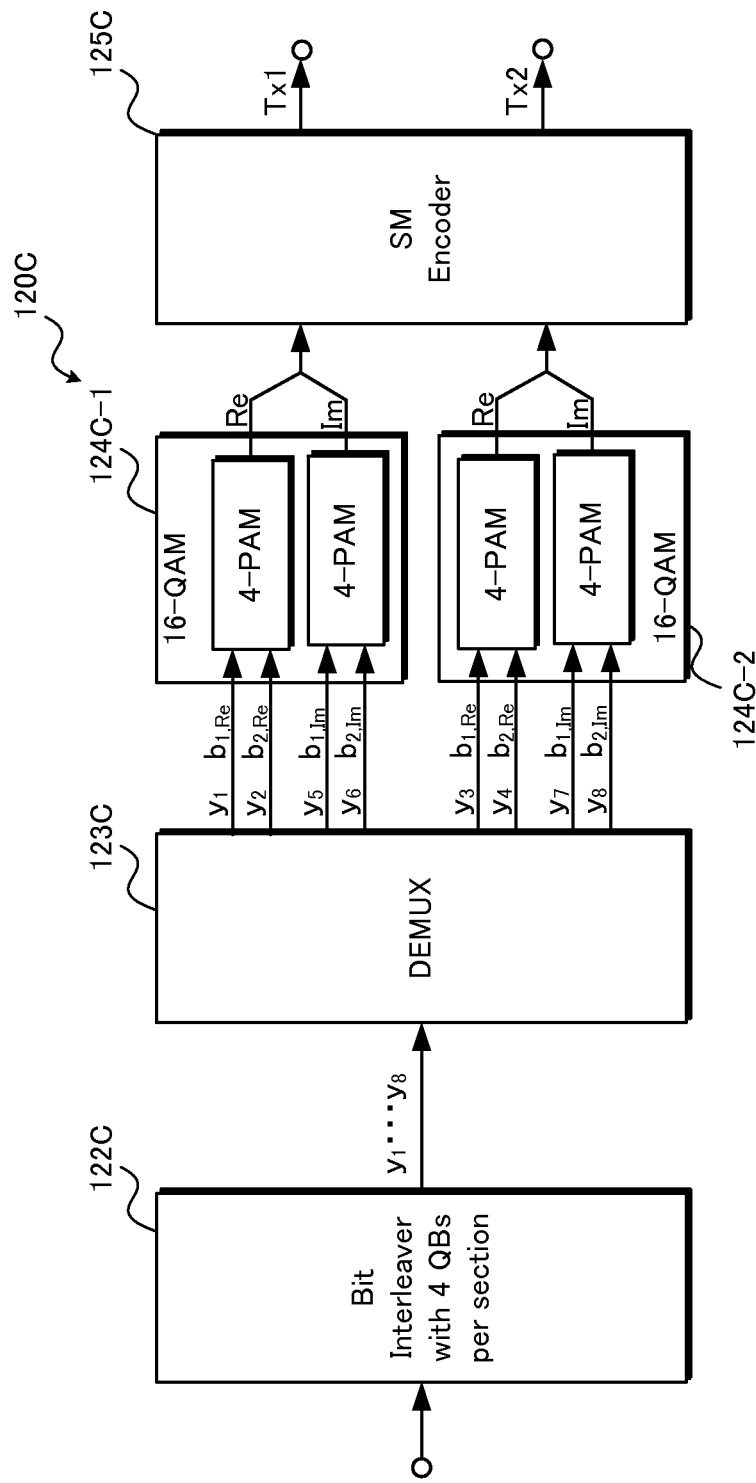

INTERLEAVING METHOD AND DEINTERLEAVING METHOD

TECHNICAL FIELD

The present invention relates to the field of digital communications, and more specifically to an interleaving method, an interleaver, a transmitter provided with the interleaver, a deinterleaving method corresponding to the interleaving method, a deinterleaver corresponding to the interleaver, and a receiver provided with the deinterleaver, which are used in bit-interleaved coding and modulation (BICM) systems with quasi-cyclic low-density parity-check (QC-LDPC) codes, quadrature amplitude modulation (QAM) and spatial multiplexing for multiple transmit antennas.

BACKGROUND ART

In recent years, communication systems including a transmitter provided with a bit-interleaved coding and modulation (BICM) encoder have been proposed (e.g. Non Patent Literature 1).

A BICM encoder performs the following steps, for example:

1) encoding data blocks by using quasi-cyclic low-density parity-check (QC-LDPC) codes, for example;
2) bit-interleaving the codeword bits obtained by the encoding, which includes parity interleaving and column-row interleaving;
3) demultiplexing the bit-interleaved codewords to obtain constellation words. The demultiplexing includes processing equivalent to permutation of columns of an interleaver matrix used in the column-row interleaving when 16QAM, 64QAM or 256QAM, for example, are adopted as the modulation scheme; and
4) mapping the constellation words onto constellations.

CITATION LIST

Non Patent Literature

NPL 1: ETSI EN 302 755 V1.2.1 (DVB-T2 standards)

SUMMARY OF INVENTION

Technical Problem

The reception performance of a communication system can be improved by appropriately mapping codeword bits, which are based on QC-LDPC codes, onto constellation words.

Similarly, in a communication system including a transmitter provided with a BICM encoder using spatial multiplexing, the reception performance of the communication system can be improved by appropriately mapping codeword bits, which are based on QC-LDPC codes, onto constellation words of a spatial-multiplexing block.

The present invention aims to provide an interleaving method, an interleaver, a transmitter provided with the interleaver, a deinterleaving method corresponding to the interleaving method, a deinterleaver corresponding to the interleaver, and a receiver provided with the deinterleaver, which are used for applying bit permutation to codeword bits based on QC-LDPC codes and appropriately mapping the codeword bits onto constellation words of at least one spatial-multiplexing block and thereby improving the reception performance of a communication system.

Solution to Problem

In order to solve the above problems, the present invention provides an interleaving method performed by a transmitter for a communication system with spatial multiplexing over T transmit antennas employing quasi-cyclic low-density parity-check codes, T being an integer greater than 1, the interleaving method being used for applying bit permutation to bits of a codeword of a quasi-cyclic low-density parity-check code in order to generate a plurality of constellation words of at least one spatial-multiplexing block from the codeword, the codeword consisting of N cyclic blocks, and each cyclic block consisting of Q bits, the spatial-multiplexing block consisting of B bits and consisting of T constellation words, each constellation word indicating one of a plurality of constellation points of a predefined constellation used for constellation mapping of the constellation word, the bits of each constellation word being divisible into pairs of bits having the same robustness, wherein the interleaving method comprises the step of applying the bit permutation to the bits of the codeword such that: at least one spatial-multiplexing block is made up of bits from B/2 different cyclic-blocks; each constellation word of the at least one spatial-multiplexing block is made up of bits from $B_t/2$ different cyclic blocks, $B_t$ being the number of bits of the constellation word; and each of the bit pairs of the constellation word is made up of bits from a common one of the $B_t/2$ different cyclic blocks.

Advantageous Effects of Invention

With the interleaving method described above, it is possible to appropriately map codeword bits based on QC-LDPC codes onto constellation words and thereby improve the reception performance of a communication system.

BRIEF DESCRIPTION OF DRAWINGS

FIG. 4 is a schematic illustration of the different robustness levels in an 8-PAM symbol with Gray encoding.

FIG. 6A is a schematic representation of a spatial-multiplexing system with 2 antennas and a number of bits per SM block equal to 4 according to an embodiment of the present invention.

FIG. 6B is a schematic representation of a spatial-multiplexing system with 2 antennas and a number of bits per SM block equal to 6 according to an embodiment of the present invention.

FIG. 6C is a schematic representation of a spatial-multiplexing system with 2 antennas and a number of bits per SM block equal to 8 according to an embodiment of the present invention.

FIG. 6D is a schematic representation of a spatial-multiplexing system with 2 antennas and a number of bits per SM block equal to 10 according to an embodiment of the present invention.

FIG. 11C shows an example of bit permutation function performed by a section permutation unit shown in FIG. 9 when B=8, according to an embodiment of the present invention.

FIG. 11D shows an example of bit permutation function performed by a section permutation unit shown in FIG. 9 when B=10, according to an embodiment of the present invention.

FIG. 12A shows an example operation for bit permutation performed by a section permutation unit shown in FIG. 11A.

FIG. 12B shows an example operation for bit permutation performed by a section permutation unit shown in FIG. 11B.

FIG. 12C shows an example operation for bit permutation performed by a section permutation unit shown in FIG. 11C.

FIG. 12D shows an example operation for bit permutation performed by a section permutation unit shown in FIG. 11D.

FIG. 13C shows an example structure of the bit-interleaved coding and modulation encoder shown in FIG. 8 when B=8.

DESCRIPTION OF EMBODIMENTS

Background of the Invention

Figure 1:
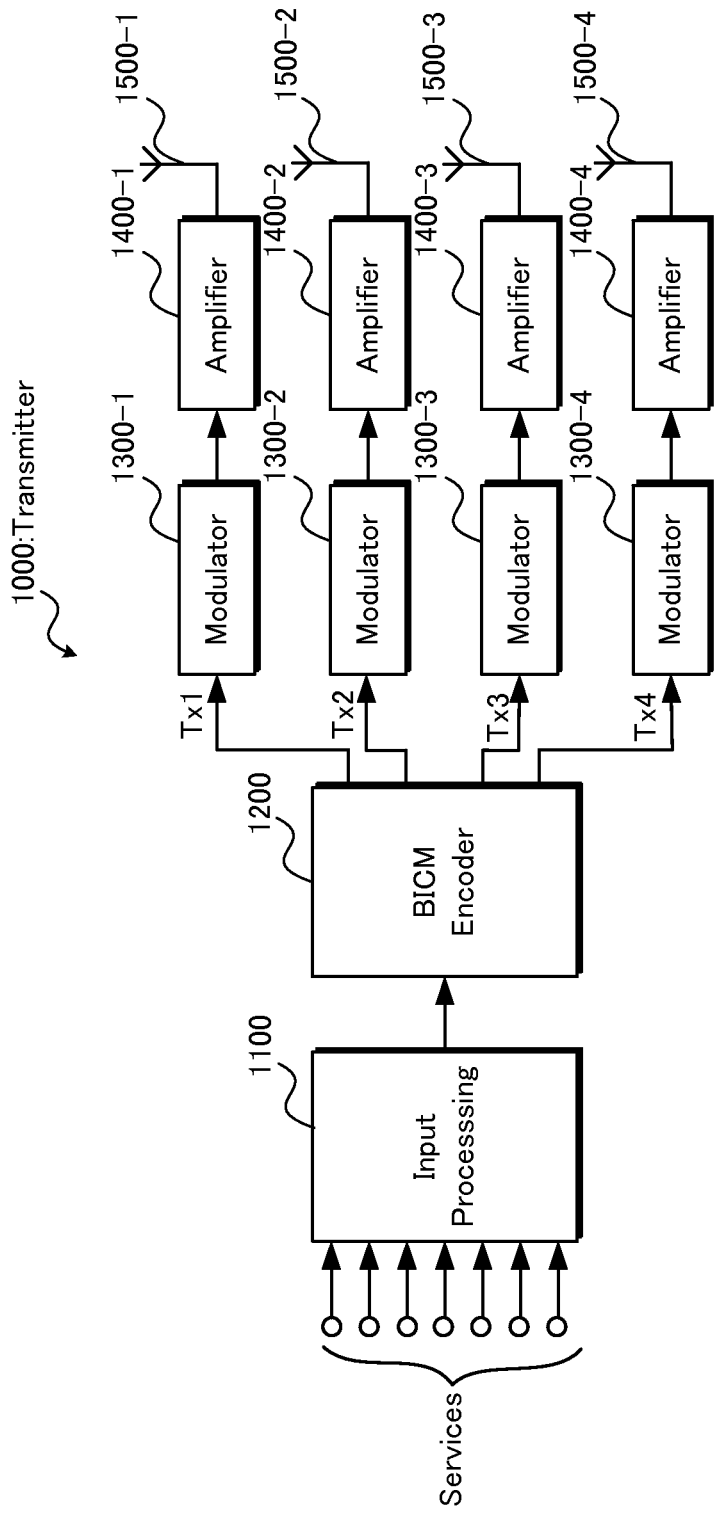
FIG. 1 is a block diagram of a transmitter performing bit-interleaved coding and modulation with spatial multiplexing over multiple antennas.

FIG. 1 is a block diagram showing a structure of a transmitter 1000. A transmitter 1000 includes an input processing unit 1100, a bit-interleaved coding and modulation (BICM) encoder 1200, modulators 1300-1 through 1300-4, power amplifiers 1400-1 through 1400-4, and transmit antennas 1500-1 through 1500-4.

The input processing unit 1100 formats input bitstreams relating to a broadcast service into blocks of a predetermined length. These blocks are called base-band frames.

The BICM encoder 1200 converts the base-band frames into a plurality of data streams consisting of complex symbols. The number of data streams is equal to the number of antennas.

Each stream is further processed by a modulation chain, which comprises at least the modulators 1300-1 through 1300-4 and the power amplifiers 1400-1 through 1400-4, and is output from the transmit antennas 1500-1 through 1500-4. Each of the modulators 1300-1 through 1300-4 performs processing such as orthogonal frequency division on the input from the BICM encoder 1200. Each of the power amplifiers 1400-1 through 1400-4 performs power amplification on the input from the modulators 1300-1 through 1300-4, respectively.

Figure 2:
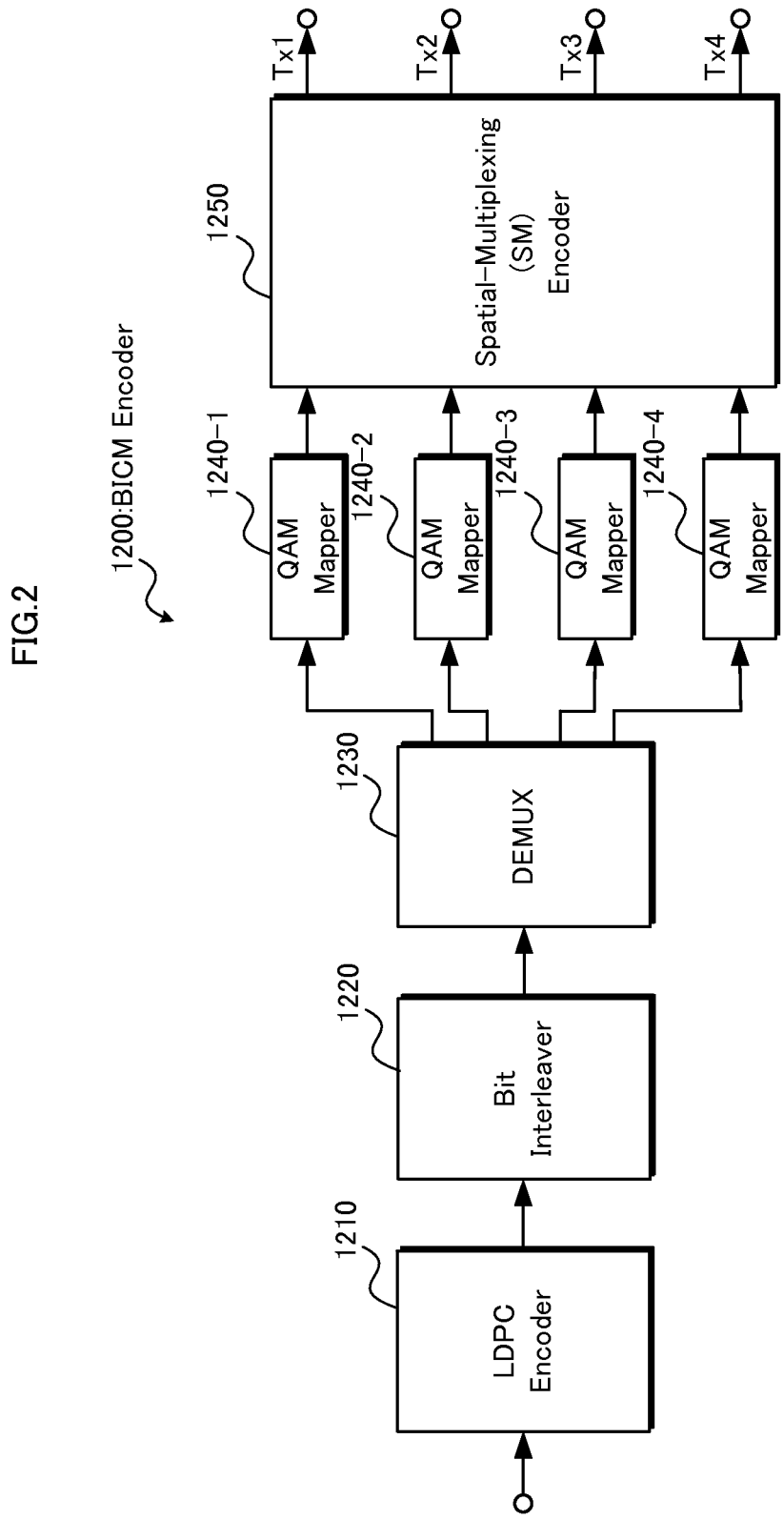
FIG. 2 is a block diagram of a bit-interleaved coding and modulation encoder for spatial multiplexing.

The following describes the details of the BICM encoder 1200 shown in FIG. 1, with reference to FIG. 2.

FIG. 2 is a block diagram of the BICM encoder 1200 for spatial multiplexing.

The BICM encoder 1200 includes an LDPC encoder 1210, a bit interleaver 1220, a demultiplexer 1230, QAM mappers 1240-1 through 1240-4, and a spatial-multiplexing (SM) encoder 1250.

The LDPC encoder 1210 encodes the input blocks, i.e. base-band frames, by using LDPC codes, to obtain a codeword, and outputs the codeword to the bit interleaver 1220.

The bit interleaver 1220 performs bit interleaving on the bits of the LDPC codeword, and outputs the bit-interleaved codeword to the demultiplexer 1230.

The demultiplexer 1230 demultiplexes the bit-interleaved codeword into a plurality of bitstreams, and outputs the bitstreams to the QAM mappers 1240-1 through 1240-4.

Each of the QAM mappers 1240-1 through 1240-4 maps a plurality of constellation words constituting the input bitstream onto a plurality of symbols, and outputs the symbols to the SM encoder 1250 which is optional. Each constellation word indicates one of a plurality of constellation points of a predefined constellation used for constellation mapping of the constellation word.

The SM encoder 1250 typically multiplies the vector of input signals by an orthogonal square matrix.

An LDPC code is a linear error-correcting code that is fully defined by its parity check matrix (PCM), which is a binary sparse matrix that represents the connection of the codeword bits (also referred to as variable nodes) to the parity checks (also referred to as check nodes). The columns and the rows of the PCM correspond to the variable and the check nodes respectively. Connections of the variable nodes to the check nodes are represented by entries "1" in the PCM.

LDPC codes have variations, and one of which is quasi-cyclic low-density parity check (QC-LDPC) codes. QC-LDPC codes have a structure that makes them particularly suitable for hardware implementation. In fact, most if not all standards today use QC-LDPC codes. The PCM of a QC-LDPC code has a special structure consisting of circulant matrices. A circulant matrix is a square matrix in which each row is a cyclic shift of the previous row with one position, and can have one, two, or more folded diagonals. The size of each circulant matrix is $Q*Q$, where Q is referred to as the cyclic factor of the LDPC code. Such a quasi-cyclic structure allows Q check nodes to be processed in parallel, which is clearly advantageous for efficient hardware implementation.

Figure 3:
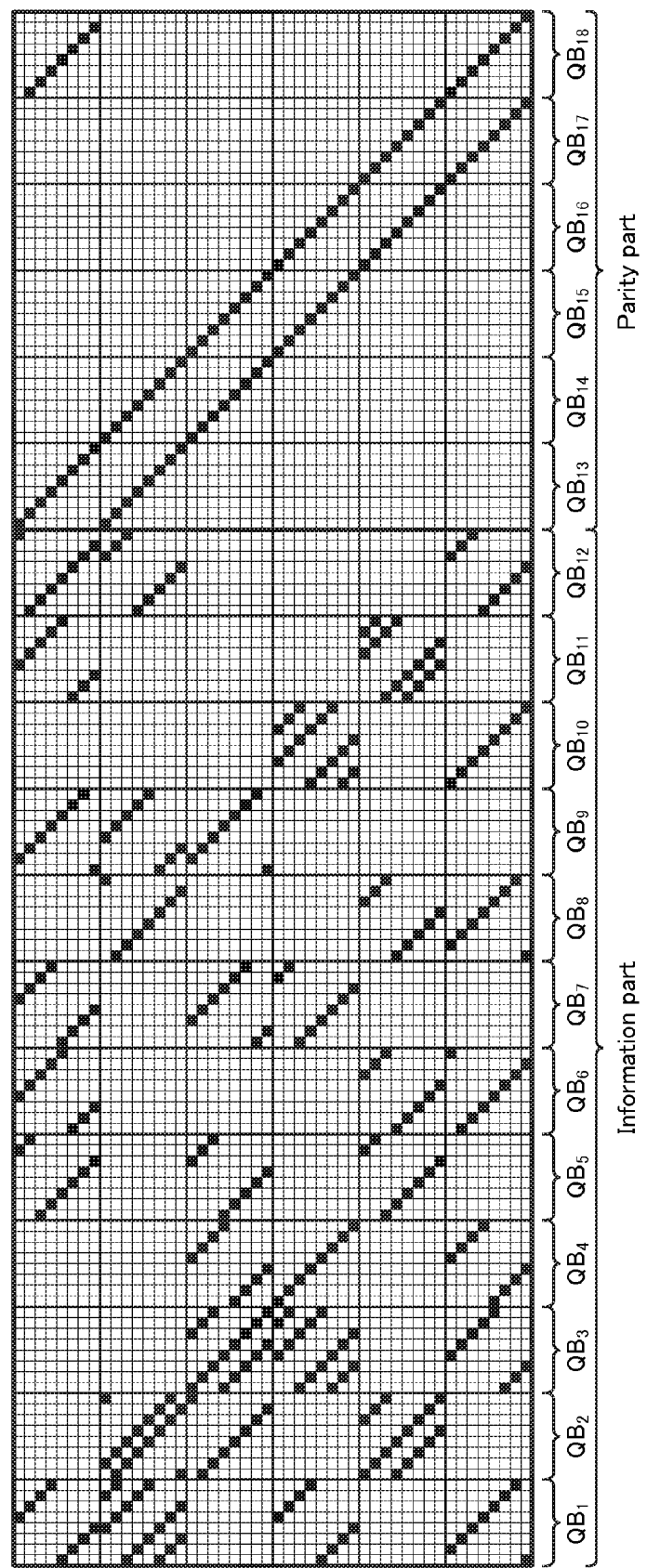
FIG. 3 shows a parity check matrix of an exemplary QC-LDPC code with cyclic factor Q=8.

FIG. 3 shows the parity check matrix of an exemplary QC-LDPC code with cyclic factor Q=8. In FIG. 3, each of the smallest squares represents one entry of the PCM, where the black entries correspond to "1" and the rest correspond to "0".

The PCM shown in FIG. 3 has circulant matrices with one or two folded diagonals. The QC-LDPC code corresponding to the PCM shown in FIG. 3 encodes a block of 8*12=96 bits to a codeword of 8*18=144 bits, having therefore a code rate of 96/144=2/3. The codeword bits are subdivided into blocks of Q bits, which will be referred to as cyclic blocks and denoted by QB throughout this Description.

The code in FIG. 3 belongs to a special family of QC-LDPC codes called repeat accumulate quasi-cyclic low-density parity check (RA QC-LDPC) codes. The RA QCLDP codes are well known for their ease of encoding and are encountered in a large number of standards, such as the second generation DVB standards: DVB-S2, DVBT2, and DVB-C2. The right-hand side part of the PCM corresponds to the parity bits, and the entries "1" in this part are arranged in a staircase structure.

Note that "DVB" stands for "Digital Video Broadcasting", "DVB-S2" stands for "Digital Video Broadcasting—Second Generation Satellite", "DVB-T2" stands for "Digital Video Broadcasting—Second Generation Terrestrial", and "DVB-C2" stands for "Digital Video Broadcasting—Second Generation Cable".

Typically, the bits of an LDPC codeword have different importance levels, and the bits of a constellation have different robustness levels. A direct, i.e. non-interleaved, mapping of the LDPC codeword bits to the constellation bits leads to a suboptimal performance. That is why the codeword bits need to be interleaved prior to being mapped onto constellations.

In order to interleave the LDPC codeword bits, the bit interleaver 1220 and the demultiplexer 1230 are used between the LDPC encoder 1210 and the QAM mappers 1240-1 through 1240-4, as illustrated in FIG. 2. By carefully designing the bit interleaver 1220 and the demultiplexer 1230, an optimal association can be achieved between the bits of the LDPC codeword and the bits encoded by the constellation, which leads to improvement of the reception performance. A typical measure of the performance is the bit error rate (BER) as a function of the signal-to-noise ratio (SNR).

The different importance levels of the bits of an LDPC codeword result primarily from the fact that not all the bits are involved in the same number of parity checks. The more parity checks (check nodes) a codeword bit (variable node) is involved in, the more important that bit is in the iterative LDPC decoding process. A further reason is the fact that the variable nodes have different connectivities to the cycles in the Tanner graph representation of the LDPC code, so they may have different importance levels even when they are involved in the same number of parity checks. These aspects are well understood in the art. As a general rule, the importance level of a variable node increases with the number of check nodes it is connected to.

In the particular case of QC-LDPC codes, all bits in a cyclic block of Q bits have the same importance since all of them are involved in the same number of parity checks and have the same connectivity to the cycles in the Tanner graph.

Likewise, the different robustness levels of the bits encoded in a constellation are a well-known fact. For instance, a complex quadrature amplitude modulation (QAM) constellation consists of two independent pulse amplitude modulation (PAM) symbols, one for the real part and one for the imaginary part. For square constellations, each of the two PAM symbols encodes the same number of bits. The bits encoded in a PAM symbol have different robustness levels. For example, FIG. 4 shows the case for an 8-PAM symbol with Gray encoding. Such different robustness levels result from the fact that the distance between the two subsets defined by a bit (0 or 1) is different for each bit. The larger the distance, the more robust or reliable the bit is. In FIG. 4, bit b3 is the most robust, whereas bit b1 is the least robust.

Figure 5C:
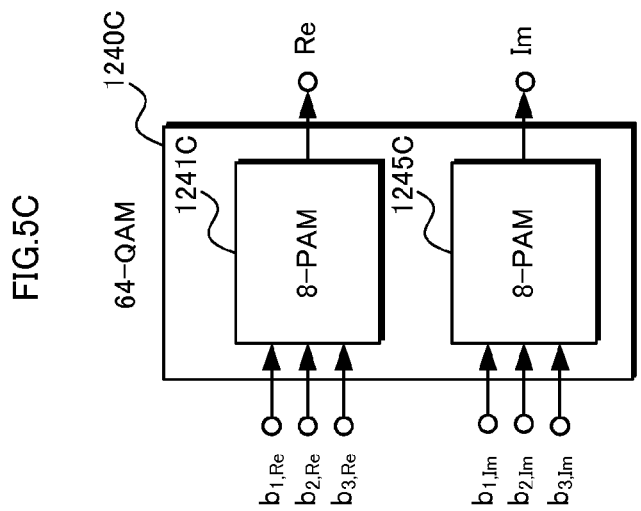
FIG. 5C is a block diagram of a QAM mapper for 64-QAM constellation.
Figure 5B:
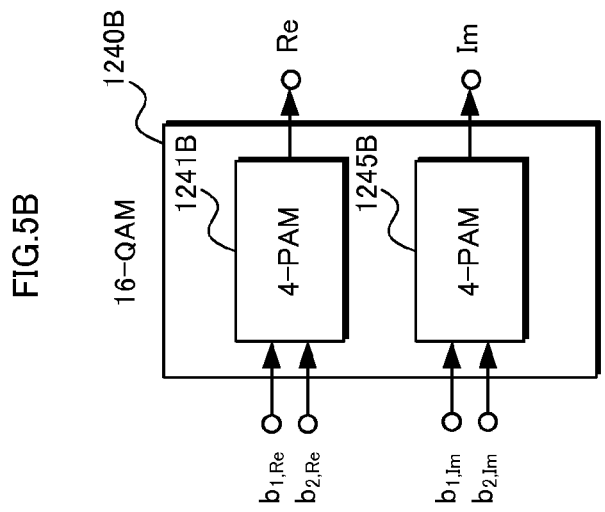
FIG. 5B is a block diagram of a QAM mapper for 16-QAM constellation.
Figure 5A:
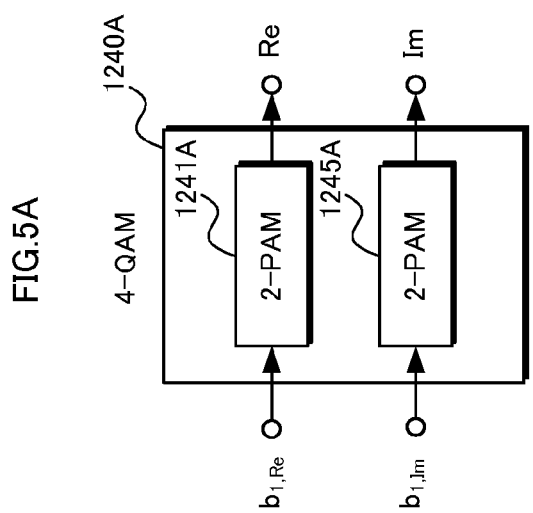
FIG. 5A is a block diagram of a QAM mapper for 4-QAM (QPSK) constellation.

QAM mappers for the most common QAM constellations are illustrated in FIGS. 5A through 5C.

FIG. 5A shows a block diagram of a QAM mapper for 4-QAM constellation. A QAM mapper 1240A includes PAM mappers 1241A and 1245A for 2-PAM constellation, one for the real part and the other for the imaginary part. Each of the PAM mappers 1241A and 1245A encodes one bit, and therefore the QAM mapper 1240A encodes two bits in total. 4-QAM constellation has one robustness level.

FIG. 5B shows a block diagram of a QAM mapper for 16-QAM constellation. A QAM mapper 1240B includes PAM mappers 1241B and 1245B for 4-PAM constellation, one for the real part and the other for the imaginary part. Each of the PAM mappers 1241B and 1245B encodes two bit, and therefore the QAM mapper 1240B encodes four bits in total. 16-QAM constellation has two robustness levels.

FIG. 5C shows a block diagram of a QAM mapper for 64-QAM constellation. A QAM mapper 1240C includes PAM mappers 1241C and 1245C for 8-PAM constellation, one for the real part and the other for the imaginary part. Each of the PAM mappers 1241C and 1245C encodes three bit, and therefore the QAM mapper 1240C encodes six bits in total. 64-QAM constellation has three robustness levels.

In each square QAM constellation, $b_{i,\ Re}$ and $b_{i,\ Im}$ ($i=1, \ldots$) have the same robustness level.

In a spatial-multiplexing system with T transmit antennas, T complex QAM complex symbols are transmitted in the same channel slot. For OFDM modulation a channel slot is represented by an OFDM cell, which is a subcarrier in an OFDM symbol. The T complex QAM symbols, which are not necessarily of the same size, form a spatial multiplexing (SM) block.

The T complex QAM symbols in an SM block can be transmitted uncoded, i.e. each over its own antenna, or an additional encoding step can be applied by SM encoder 1250 as shown in FIG. 2, whereby T QAM symbols are jointly encoded.

The encoding typically consists in multiplying the vector of 2T real components by an orthogonal square matrix. In the most general case, the encoding can be applied over multiple K channel slots, i.e. to K*T complex QAM symbols, which exploits the additional time and/or frequency diversity available over the K channel slots.

Throughout this Description, the number of bits transmitted in a channel slot is denoted by B and the number of bits in each complex QAM symbol by $B_t$, where t is the antenna index between 1 and T.

Embodiment

It is the particular approach of the present invention to provide an interleaving method for interleaving the bits of a codeword based on QC-LDPC codes (QC-LDPC codeword) while ensuring the following conditions:

(i) the $B_t$ bits of each QAM symbol are mapped to exactly $B_t/2$ cyclic blocks of the QC-LDPC codeword in such a way that each of the $B_t/2$ cyclic blocks is associated with bits of the same robustness; and (ii) the T QAM symbols of a spatial-multiplexing (SM) block are mapped onto different cyclic blocks of the QC-LDPC codeword.

In other words:

(I) each constellation word is made up of bits from $B_t/2$ different cyclic blocks of the codeword;

(II) each pair of constellation word bits that have the same robustness is made up of bits from the same cyclic block; and (III) constellation words for different antennas are made up of bits from different cyclic blocks.

An SM block is made up of bits from B/2 cyclic blocks.

An SM block consists of B bits, and consists of T constellation words.

In a preferred embodiment of the present invention, the communication system employs square QAM constellations. Therefore, the number of bits per constellation word for antenna t, $B_t$, is always an even number and the two QAM components (real and imaginary part) are each modulated by the same number of bits, $B_t/2$.

Preferably, the Q*B/2 bits of the B/2 cyclic blocks are mapped to Q/2 spatial-multiplexing blocks. In this case, the B/2 cyclic blocks are referred to as a section.

Such a configuration is shown in FIGS. 6A to 6D for a spatial-multiplexing system with two antennas and a number of bits per spatial-multiplexing block equal to 4, 6, 8, and 10 respectively. The thick borders group bits belonging to the same SM block. In these examples the LDPC parameters are: the cyclic factor Q=8, and the number of cyclic blocks per codeword N=15.

The mapping of the bits of a certain section to the corresponding constellation words may be performed independently of the other sections. This allows for a particularly efficient implementation, wherein a plurality of section permutation units are provided, one for each section, that are adapted for parallel operation. This implementation will be referred to as a parallel interleaver. Instead of providing one section permutation unit for each section, a smaller number of section permutation units than the number of sections may be used by a time-division scheme.

For the cases where N is not a multiple of B/2, i.e. B=4 and 8 in the above examples, the codeword cannot be divided into sections of B/2 cyclic blocks each. Therefore, the codeword is divided into (i) a group of X cyclic blocks, where X is the remainder when N is divided by B/2 (this group is hereinafter referred to as "remainder group"), and (ii) a group of one or more sections each consisting of B/2 cyclic blocks. The mapping for the remainder group is not a subject of the present invention. One option is to perform the mapping sequentially.

For the cases where N is a multiple of B/2, i.e. B=6 and 10 in the above examples, the coded word can be divided into one or more sections of B/2 cyclic blocks each.

Moreover, the order of the N cyclic blocks is usually different from their order in the LDPC code definition, the order being defined by an N-element permutation.

<Transmitter>

The following describes a transmitter included in a communication system according to an embodiment of the present invention, with reference to the drawings.

Figure 7:
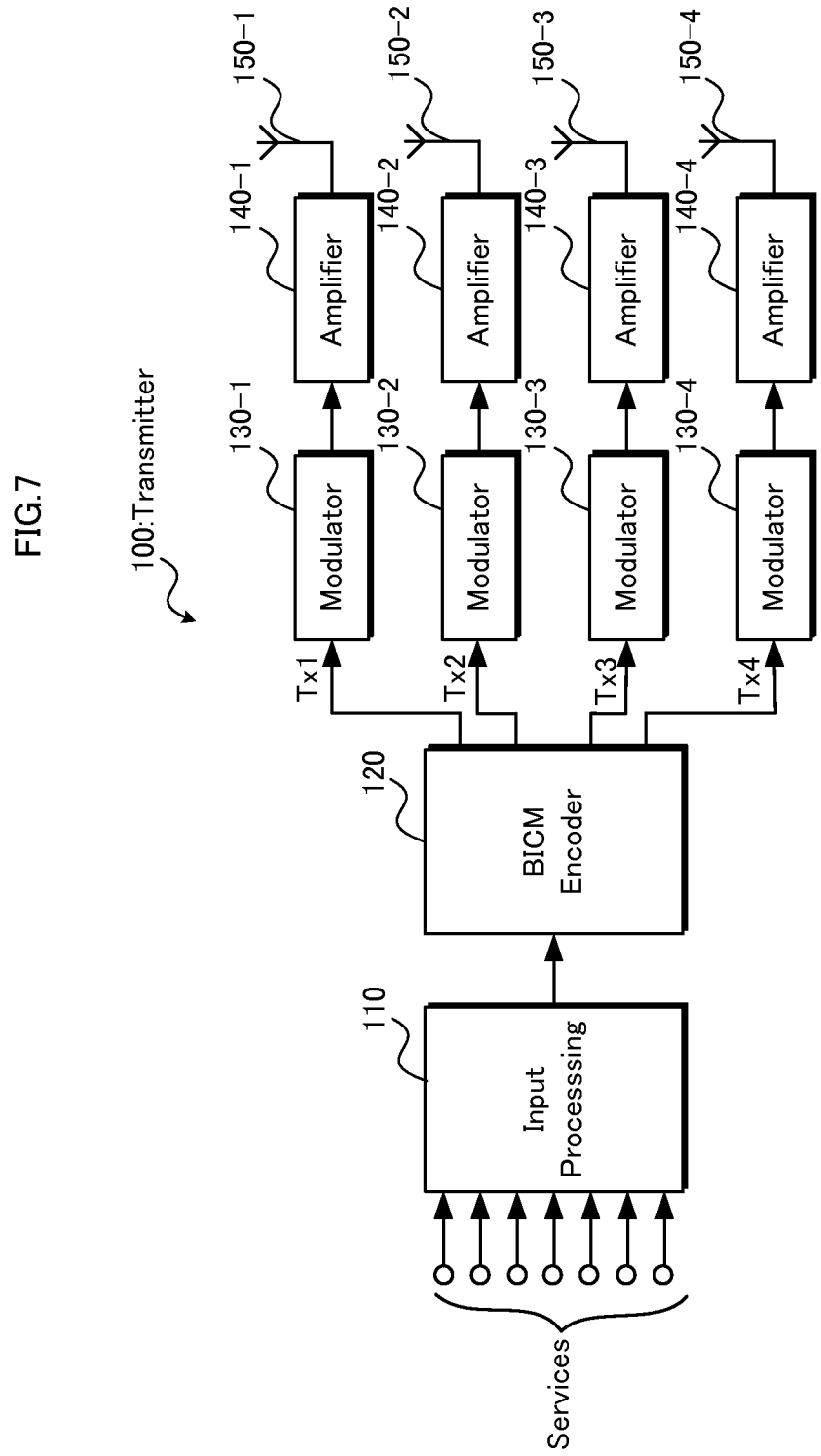
FIG. 7 is a block diagram of a transmitter included in a communication system according to an embodiment of the present invention.

FIG. 7 is a block diagram of a transmitter 100 according to an embodiment of the present invention. The transmitter 100 includes an input processing unit 110, a bit-interleaved coding and modulation (BICM) encoder 120, modulators 130-1 through 130-4, power amplifiers 140-1 through 140-4, and transmit antennas 150-1 through 150-4. Except for the BICM encoder 120, each component performs substantially the same processing as the corresponding component of the transmitter 1000 shown in FIG. 1, and the detailed descriptions are omitted.

Figure 8:
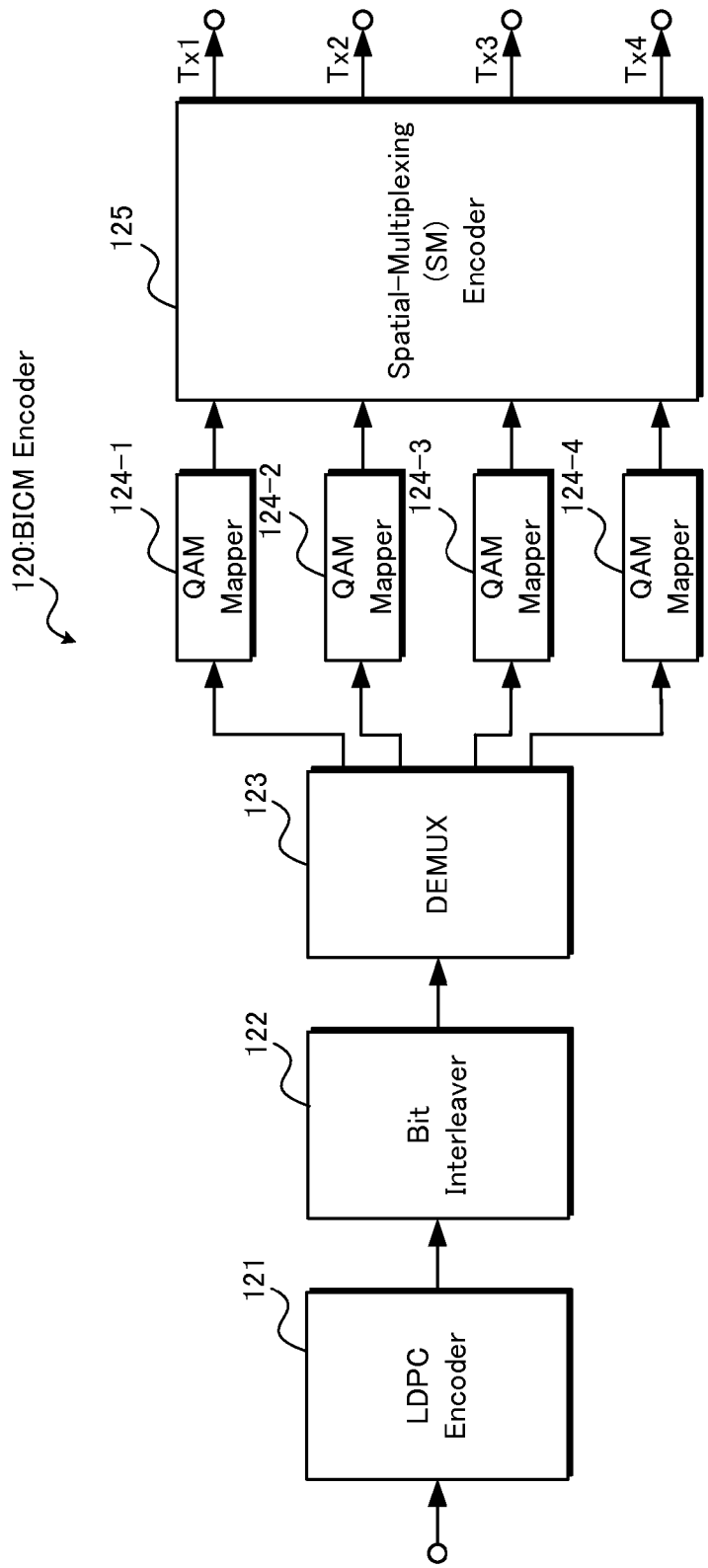
FIG. 8 is a block diagram of the BICM encoder shown in FIG. 7.

The following describes in detail the BICM encoder 120 shown in FIG. 7, with reference to FIG. 8.

FIG. 8 is a block diagram of the BICM encoder 120 shown in FIG. 7.

The BICM encoder 120 includes an LDPC encoder 121, a bit interleaver 122, a demultiplexer 123, QAM mappers 124-1 through 124-4, and a spatial-multiplexing (SM) encoder 125. Except for the bit interleaver 122 and the demultiplexer 123, each component performs substantially the same processing as the corresponding component of the BICM encoder 1200 shown in FIG. 2.

The LDPC encoder 121 generates a codeword by using LDPC codes and outputs the codeword to the bit interleaver 122. The codeword generated by the LDPC encoder 121 consists of N cyclic blocks, and each cyclic block consists of Q bits.

The bit interleaver 122 receives the codeword from the LDPC encoder 121, and interleaves the bits of the received codeword. The demultiplexer 123 demultiplexes the interleaved bits of the codeword (i.e. divides the bits into a plurality of bit sequences, and applies permutation to the bit sequences), and maps the bits onto constellation words. The bit interleaver 122 and the demultiplexer 123 perform their respective processing so as to fulfill the conditions (i) and (ii), namely conditions (I), (II) and (III).

Each of the QAM mappers 124-1 through 124-4 maps the constellation words provided by the demultiplexer 123 onto complex QAM symbols. The SM encoder 125 performs coding for spatial-multiplexing on the complex QAM symbols provided by the QAM mappers 124-1 through 124-4.

Figure 9:
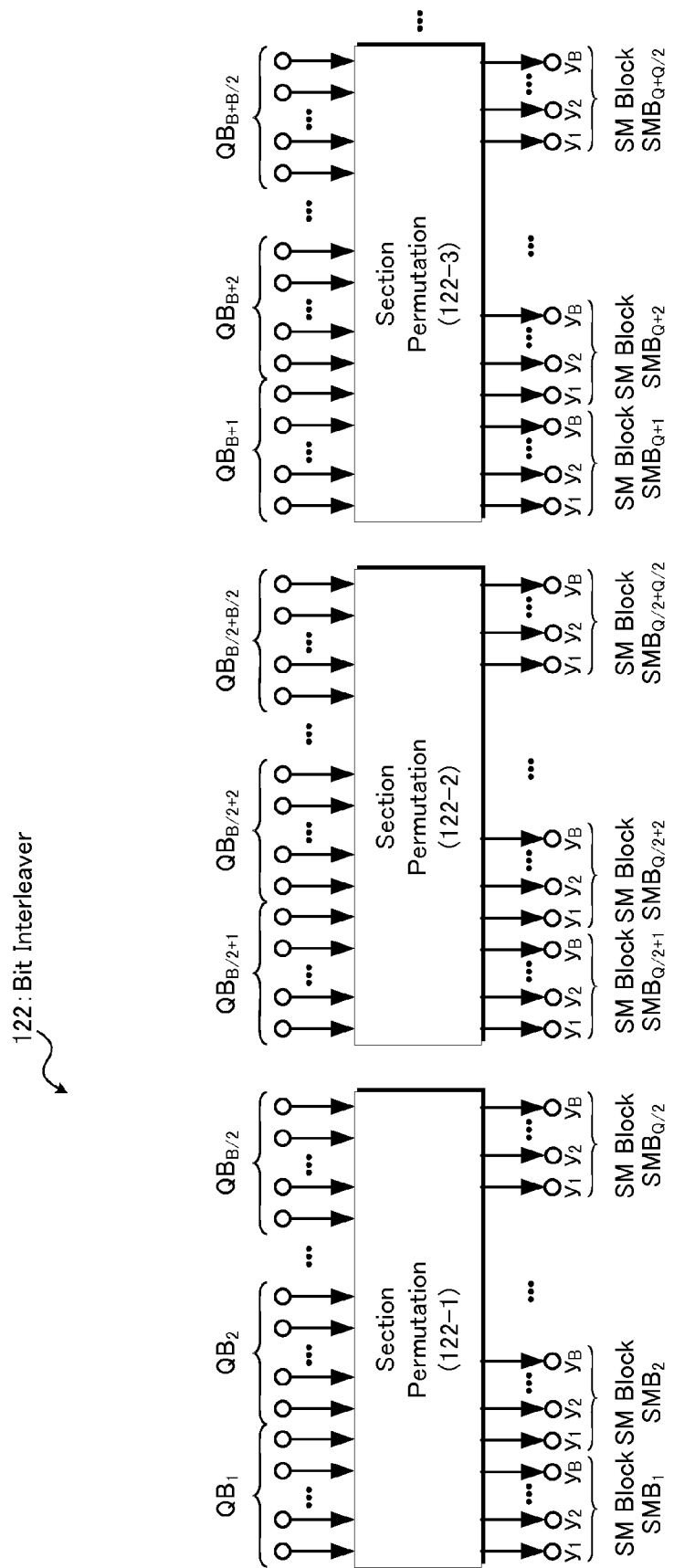
FIG. 9 is a block diagram showing an example structure of the bit interleaver shown in FIG. 8.

The following explains an example of the bit interleaver 122 shown in FIG. 8, with reference to FIG. 9.

FIG. 9 is a block diagram showing an example structure of the bit interleaver 122 shown in FIG. 8.

In the case of the bit interleaver 122 whose example structure is shown in FIG. 9, N cyclic blocks are divided into (i) a group of one or more sections each consisting of B/2 cyclic blocks and (ii) a group of X cyclic blocks, where X is the remainder when N is divided by B/2 (i.e. remainder group). When N is a multiple of B/2, no remainder group exists.

For example, when N=15, Q=8, B=4, which is the case corresponding to the case shown in FIG. 6A, the number of the cyclic blocks associated with one section is B/2=2, the number of the spatial-multiplexing blocks (SM blocks) is Q/2=4, the number of the sections is 7, and the number of the cyclic blocks in the remainder group is 1.

When N=15, Q=8, B=6, which is the case corresponding to the case shown in FIG. 6B, the number of the cyclic blocks associated with one section is B/2=3, the number of the spatial-multiplexing blocks (SM blocks) is Q/2=4, and the number of the sections is 5.

When N=15, Q=8, B=8, which is the case corresponding to the case shown in FIG. 6C, the number of the cyclic blocks associated with one section is B/2=4, the number of the spatial-multiplexing blocks (SM blocks) is Q/2=4, the number of the sections is 3, and the number of the cyclic blocks in the remainder group is 3.

When N=15, Q=8, B=10, which is the case corresponding to the case shown in FIG. 6D, the number of the cyclic blocks associated with one section is B/2=5, the number of the spatial-multiplexing blocks (SM blocks) is Q/2=4, and the number of the sections is 3.

The bit interleaver 122, whose example structure is shown in FIG. 9, includes section permutation units 122-1, 122-2, 122-3 and so on, for each section. When N is not a multiple of B/2, some cyclic blocks does not belong to any section. With respect to such cyclic blocks, namely blocks not belonging to any section, bit permutation may not be performed or performed according to a given permutation rule.

Each of the section permutation units 122-1, 122-2, 122-3 and so on outputs Q*(B/2) bits of the B/2 cyclic blocks after applying bit permutation to them so that Q bits of cyclic block QB are mapped to two bits of each of Q/2 SM blocks. Then, the demultiplexer 123 outputs the constellation words after applying bit permutation for each SM block so that two bits in the same cyclic block in each SM block is mapped to two bits having the same robustness in the same constellation word.

The section permutation units 122-1, 122-2, 122-3 and so on may operate independently from each other. It is not necessary that one section permutation unit is provided for each section. A smaller number of section permutation units than the number of sections may be used by a time-division scheme.

Figure 10:
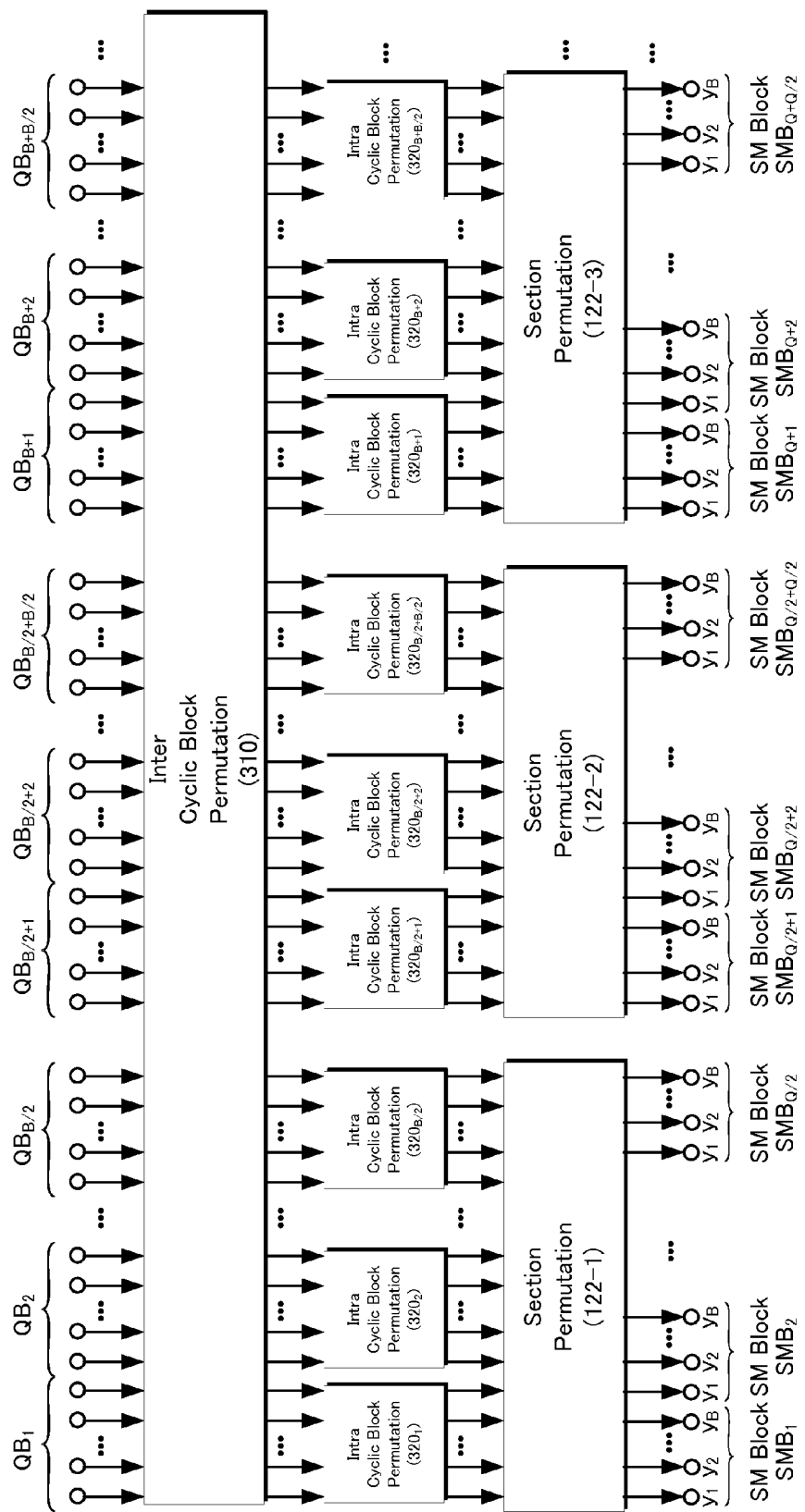
FIG. 10 is a block diagram showing another example structure of the bit interleaver shown in FIG. 8.

The bit interleaver 122 shown in FIG. 8 may include an inter cyclic block permutation unit 310 and intra cyclic block permutation units $320_1$ and so on as shown in FIG. 10 in addition to the structure as shown in FIG. 9.

The inter cyclic block permutation unit 310 applies permutation to cyclic blocks, and the intra cyclic units $310_1$ and so on apply bit permutation to the bits of the cyclic blocks.

The permutation of the cyclic blocks applied by the inter block permutation unit 310 is not limited to any particular manner. For example, the inter block permutation unit 310 may apply permutation to the cyclic blocks such that bits of a cyclic block consisting of more important bits are mapped to bits with higher robustness of a constellation word, considering the bit permutation by the section permutation units and the bit permutation by the demultiplexer.

Regarding the structure of the bit interleaver, either one of the inter cyclic block permutation unit 310 or the intra cyclic block permutation units $320_1$ and so on may be removed from the structure shown in FIG. 10. Also, the inter cyclic block permutation unit 310 and the intra cyclic block permutation units $320_1$ and so on may be interchanged with each other. The intra cyclic block permutation units $320_1$ and so on may operate independently from each other. It is not necessary that one intra cyclic block permutation unit is provided for each cyclic block. A smaller number of intra cyclic block permutation units than the number of cyclic blocks may be used by a time-division scheme.

The following explains an example operation of a section permutation unit shown in FIG. 9 when Q=8 and B=4, 6, 8 or 10, with reference to FIGS. 11A through 11D and FIGS. 12A through 12D.

Figure 11A:
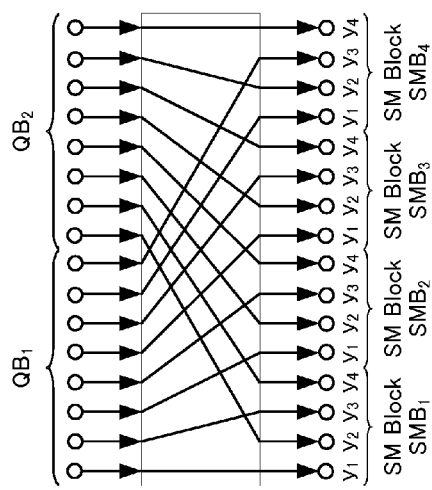
FIG. 11A shows an example of bit permutation function performed by a section permutation unit shown in FIG. 9 when B=4, according to an embodiment of the present invention.

FIG. 11A shows an example of the bit permutation function performed by a section permutation unit when Q=8 and B=4. FIG. 12A shows an example operation for bit permutation performed by the section permutation unit shown in FIG. 11A.

As shown in FIG. 11A, the section permutation unit 122-1A applies bit permutation to the input bits so that the bits of the two (i.e. B/2=2) cyclic blocks $QB_1$ and $QB_2$ are mapped to the bits of four (i.e. Q/2=4) SM blocks $SMB_1$ through $SMB_4$.

To apply bit permutation to the input bits shown in FIG. 11A, the section permutation unit 122-1A performs processing that is equivalent to column-row interleaving as shown in FIG. 12A for example, by which the section permutation unit 122-1A writes bits row-wise into an interleaver matrix having Q columns and B/2 rows (=eight columns and two rows) and reads bits column-wise from the interleaver matrix. In FIG. 12A, and in FIGS. 12B through 12D which will be described later, the order of bit writing is represented by a dotted arrow, and the order of bit reading is represented by a bold arrow.

Figure 11B:
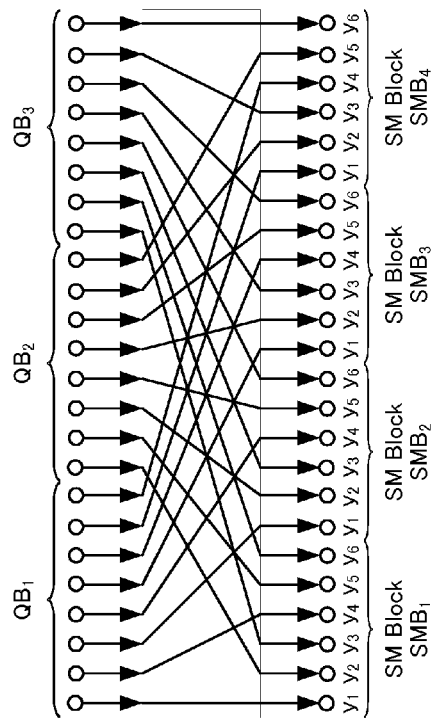
FIG. 11B shows an example of bit permutation function performed by a section permutation unit shown in FIG. 9 when B=6, according to an embodiment of the present invention.

FIG. 11B shows an example of the bit permutation function performed by a section permutation unit when Q=8 and B=6. FIG. 12B shows an example operation for bit permutation performed by the section permutation unit shown in FIG. 11B.

As shown in FIG. 11B, the section permutation unit 122-1B applies bit permutation to the input bits so that the bits of the three (i.e. B/2=3) cyclic blocks $QB_1$ through $QB_3$ are mapped to the bits of four (i.e. Q/2=4) SM blocks $SMB_1$ through $SMB_4$.

To apply bit permutation to the input bits shown in FIG. 11B, the section permutation unit 122-1B performs processing that is equivalent to column-row interleaving as shown in FIG. 12B for example, by which the section permutation unit 122-1B writes bits row-wise into an interleaver matrix having Q columns and B/2 rows (=eight columns and three rows) and reads bits column-wise from the interleaver matrix.

FIG. 11C shows an example of the bit permutation function performed by a section permutation unit when Q=8 and B=8. FIG. 12C shows an example operation for bit permutation performed by the section permutation unit shown in FIG. 11C.

As shown in FIG. 11C, the section permutation unit 122-1C applies bit permutation to the input bits so that the bits of the four (i.e. B/2=4) cyclic blocks $QB_1$ through $QB_4$ are mapped to the bits of four (i.e. Q/2=4) SM blocks $SMB_1$ through $SMB_4$.

To applies bit permutation to the input bits shown in FIG. 11C, the section permutation unit 122-1C performs processing that is equivalent to column-row interleaving as shown in FIG. 12C for example, by which the section permutation unit 122-1C writes bits row-wise into an interleaver matrix having Q columns and B/2 rows (=eight columns and four rows) and reads bits column-wise from the interleaver matrix.

FIG. 11D shows an example of the bit permutation function performed by a section permutation unit when Q=8 and B=10. FIG. 12D shows an example operation for bit permutation performed by the section permutation unit shown in FIG. 11D.

As shown in FIG. 11D, the section permutation unit 122-1D applies bit permutation to the input bits so that the bits of the five (i.e. B/2=5) cyclic blocks $QB_1$ through $QB_5$ are mapped to the bits of four (i.e. Q/2=4) SM blocks $SMB_1$ through $SMB_4$.

To apply bit permutation to the input bits shown in FIG. 11D, the section permutation unit 122-1D performs processing that is equivalent to column-row interleaving as shown in FIG. 12D for example, by which the section permutation unit 122-1D writes bits row-wise into an interleaver matrix having Q columns and B/2 rows (=eight columns and five rows) and reads bits column-wise from the interleaver matrix.

Each section permutation unit described with reference to FIGS. 11A through 11D and FIGS. 12A through 12D can be generalized as follows.

The input bits to the section permutation unit are the bits of cyclic blocks $QB_{B/2*i+1}$ thorough $QB_{B/2*i+B/2}$, and the output bits to the section permutation unit are the bits of SM blocks $SMB_{Q/2*i+1}$ through $SMB_{Q/2*i+Q/2}$. The section permutation unit performs processing that is equivalent to column-row interleaving, by which the section permutation unit writes bits row-wise into an interleaver matrix having Q columns and B/2 rows, and reads column-wise from the interleaver matrix.

The following describes example operations performed by the bit interleaver, demultiplexer and QAM mapper pathway of the BICM encoder 120 shown in FIG. 8, with reference to FIGS. 13A through 13D. It is assumed that the number of transmit antennas (i.e. the number of constellation words for each SM block) is two.

Figure 13A:
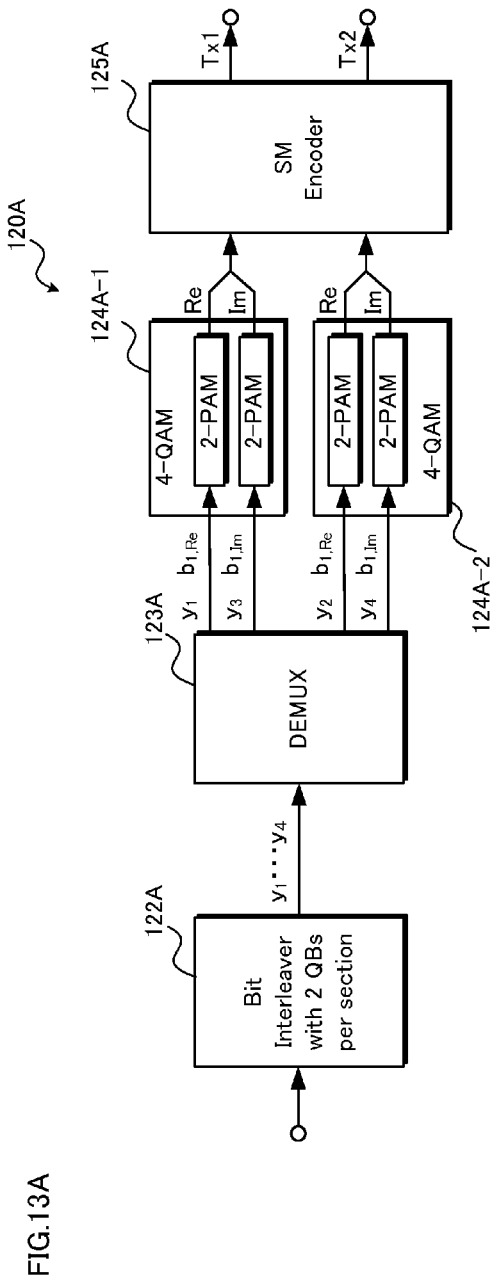
FIG. 13A shows an example structure of the bit-interleaved coding and modulation encoder shown in FIG. 8 when B=4.

FIG. 13A shows an example structure of the bit interleaver, demultiplexer and QAM mapper pathway of a BICM encoder when B=4.

The LDPC codewords generated by the LDPC encoder (not depicted in this figure. See FIG. 8) included in the BICM encoder 120A is fed to the bit interleaver 122A, which includes the section permutation unit described with reference to FIG. 11A and FIG. 12A. The bits of the LDPC codewords are interleaved by the bit interleaver 122A, and the codewords with the interleaved bits are fed to the demultiplexer 123A.

In the example shown in FIG. 13A, the demultiplexer 123A applies bit permutation to the bits $y_1$ through $y_4$ to arrange them in the order of $y_1$, $y_3$, $y_2$, $y_4$. As a result, the bits ($y_1$, $y_3$) are mapped to the constellation word $C_A$ ($b_{1,Re}$, $b_{1,Im}$) and the bits ($y_2$, $y_4$) are mapped to the constellation word $C_B$ ($b_{1,Re}$, $b_{1,Im}$).

Each of the 4-QAM mappers 124A-1 and 124A-2 map the constellation words $C_A$ and $C_B$, namely ($b_{1,Re}$, $b_{1,Im}$) to the complex symbols (Re, Im) by using their respective two 2-PAM mappers.

The SM encoder 125A performs coding for spatial-multiplexing on the complex symbols to generate transmission signals Tx1 and Tx2.

Figure 13B:
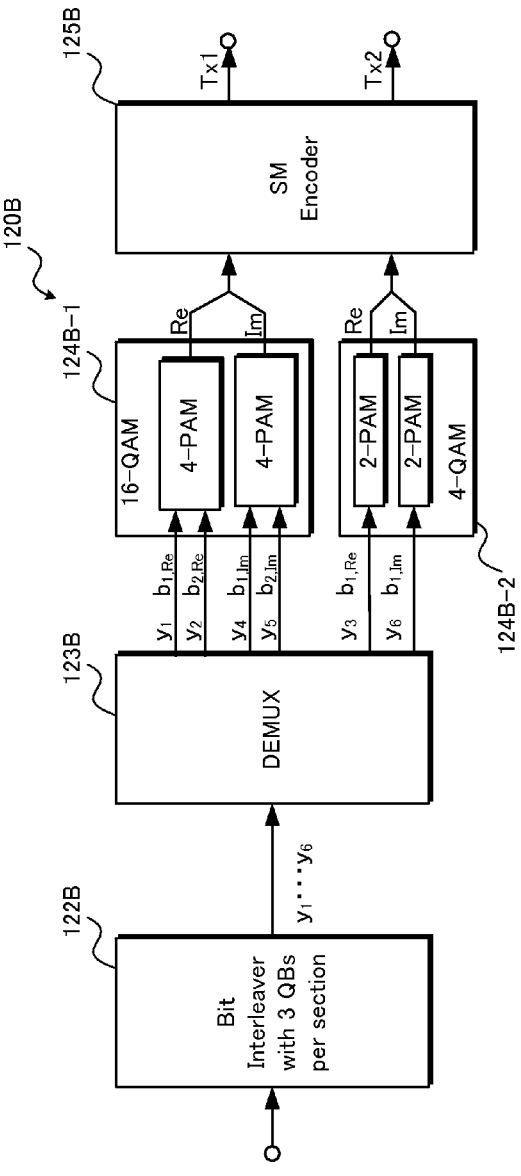
FIG. 13B shows an example structure of the bit-interleaved coding and modulation encoder shown in FIG. 8 when B=6.

FIG. 13B shows an example structure of the bit interleaver, demultiplexer and QAM mapper pathway of a BICM encoder when B=6.

The LDPC codewords generated by the LDPC encoder (not depicted in this figure. See FIG. 8) included in the BICM encoder 120B is fed to the bit interleaver 122B, which includes the section permutation unit described with reference to FIG. 11B and FIG. 12B. The bits of the LDPC codewords are interleaved by the bit interleaver 122B, and the codewords with the interleaved bits are fed to the demultiplexer 123B.

In the example shown in FIG. 13B, the demultiplexer 123B applies bit permutation to the bits $y_1$ through $y_6$ to arrange them in the order of $y_1$, $y_2$, $y_4$, $y_5$, $y_3$, $y_6$. As a result, the bits ($y_1$, $y_2$, $y_4$, $y_5$) are mapped to the constellation word $C_A$ ($b_{1,Re}$, $b_{2,Re}$, $b_{1,Im}$, $b_{2,Im}$) and the bits ($y_3$, $y_6$) are mapped to the constellation word $C_B$ ($b_{1,Re}$, $b_{1,Im}$).

The 16-QAM mapper 124B-1 maps the constellation word $C_A$ ($b_{1,Re}$, $b_{2,Re}$, $b_{1,Im}$, $b_{2,Im}$) to the complex symbol (Re, Im) by using two 4-PAM mappers. The 16-QAM mapper 124B-2 maps the constellation words $C_B$ ($b_{1,Re}$, $b_{1,Im}$) to the complex symbol (Re, Im) by using two 2-PAM mappers.

The SM encoder 125B performs coding for spatial-multiplexing on the complex symbols to generate transmission signals Tx1 and Tx2.

FIG. 13C shows an example structure of the bit interleaver, demultiplexer and QAM mapper pathway of a BICM encoder when B=8.

The LDPC codewords generated by the LDPC encoder (not depicted in this figure. See FIG. 8) included in the BICM encoder 120C is fed to the bit interleaver 122C, which includes the section permutation unit described with reference to FIG. 11C and FIG. 12C. The bits of the LDPC codewords are interleaved by the bit interleaver 122C, and the codewords with the interleaved bits are fed to the demultiplexer 123C.

In the example shown in FIG. 13C, the demultiplexer 123C applies bit permutation to the bits $y_1$ through $y_8$ to arrange them in the order of $y_1$, $y_2$, $y_5$, $y_6$, $y_3$, $y_4$, $y_7$, $y_8$. As a result, the bits ($y_1$, $y_2$, $y_8$, $y_6$) are mapped to the constellation word $C_A$ ($b_{1,Re}$, $b_{2,Re}$, $b_{1,Im}$, $b_{2,Im}$), and the bits ($y_3$, $y_4$, $y_7$, $y_8$) are mapped to the constellation word $C_B$ ($b_{1,Re}$, $b_{2,Re}$, $b_{1,Im}$, $b_{2,Im}$).

Each of the 16-QAM mappers 124C-1 and 124C-2 map the constellation words $C_A$ and $C_B$, namely ($b_{1,Re}$, $b_{2,Re}$, $b_{1,Im}$, $b_{2,Im}$), to the complex symbols (Re, Im) by using their respective two 4-PAM mappers.

The SM encoder 125C performs coding for spatial-multiplexing on the complex symbols to generate transmission signals Tx1 and Tx2.

Figure 13D:
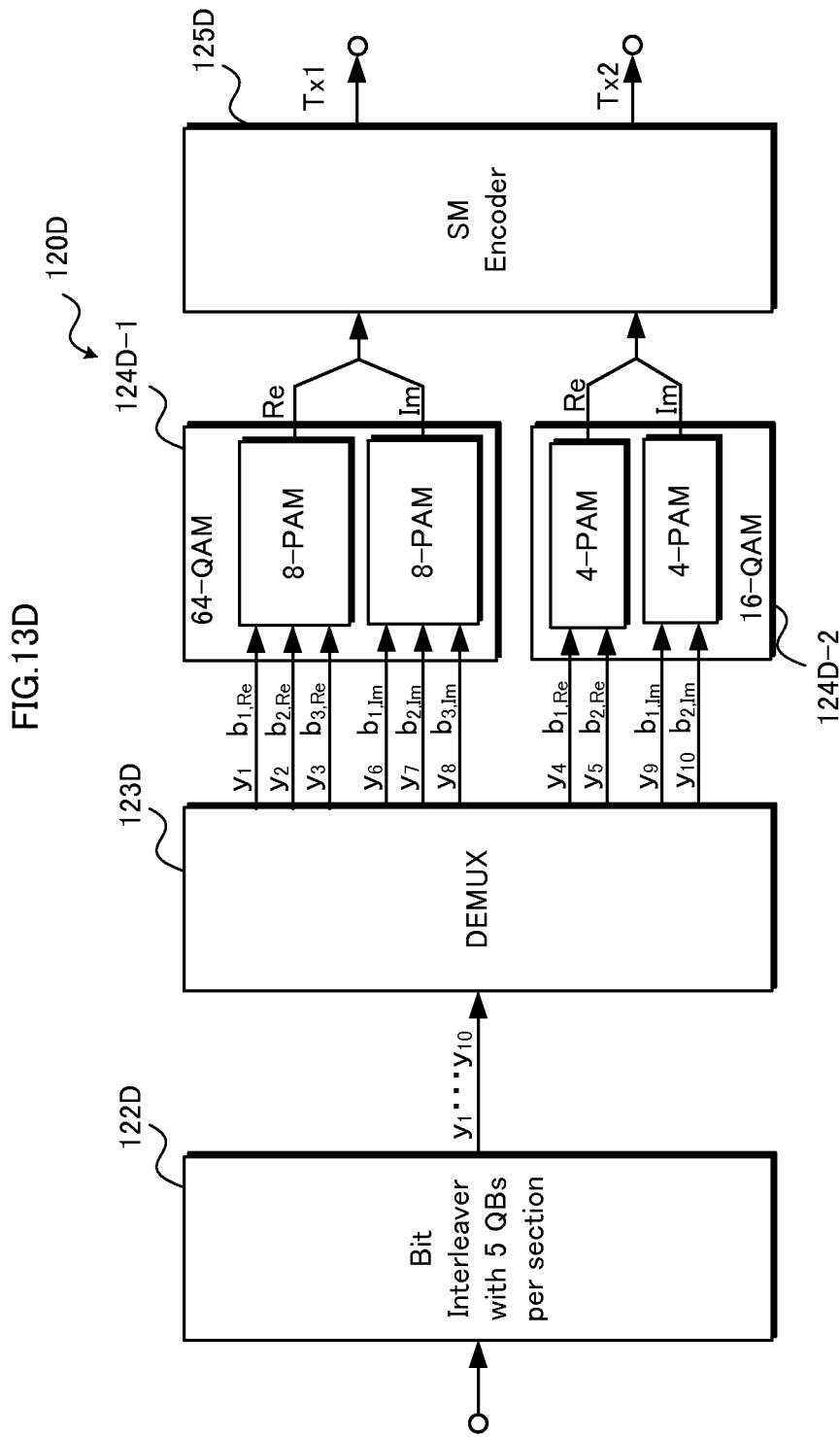
FIG. 13D shows an example structure of the bit-interleaved coding and modulation encoder shown in FIG. 8 when B=10.

FIG. 13D shows an example structure of the bit interleaver, demultiplexer and QAM mapper pathway of a BICM encoder when B=10.

The LDPC codewords generated by the LDPC encoder (not depicted in this figure. See FIG. 8) included in the BICM encoder 120D is fed to the bit interleaver 122D, which includes the section permutation unit described with reference to FIG. 11D and FIG. 12D. The bits of the LDPC codewords are interleaved by the bit interleaver 122D, and the codewords with the interleaved bits are fed to the demultiplexer 123D.

In the example shown in FIG. 13D, the demultiplexer 123D applies bit permutation to the bits $y_1$ through $y_{10}$ to arrange them in the order of $y_1$, $y_2$, $y_3$, $y_6$, $y_7$, $y_8$, $y_4$, $y_5$, $y_9$, $y_{10}$. As a result, the bits ($y_1$, $y_2$, $y_3$, $y_6$, $y_7$, $y_8$) are mapped to the constellation word $C_A$ ($b_{1,Re}$, $b_{2,Re}$, $b_{3,Re}$, $b_{1,Im}$, $b_{2,Im}$, $b_{3,Im}$), and the bits ($y_4$, $y_5$, $y_9$, $y_{10}$) are mapped to the constellation word $C_B$ ($b_{1,Re}$, $b_{2,Re}$, $b_{1,Im}$, $b_{2,Im}$).

The 64-QAM mapper 124D-1 maps the constellation word $C_A$ ($b_{1,Re}$, $b_{2,Re}$, $b_{3,Re}$, $b_{1,Im}$, $b_{2,Im}$, $b_{3,Im}$) to the complex symbol (Re, Im) by using two 8-PAM mappers. The 16-QAM mapper 124D-2 maps the constellation words $C_B$ ($b_{1,Re}$, $b_{2,Re}$, $b_{1,Im}$, $b_{2,Im}$) to the complex symbol (Re, Im) by using two 4-PAM mappers.

The SM encoder 125D performs coding for spatial-multiplexing on the complex symbols to generate transmission signals Tx1 and Tx2.

Each demultiplexer described with reference to FIGS. 13A through 13D and FIGS. 12A through 12D can be generalized as follows. Here, it is assumed that the number of bits of an SM block is B, the number of antennas (constellation words) is T, the number of bits of a constellation word $C_i$ is $B_i=2*M_i$. Here, i denotes the index of an antenna (constellation word) and is an integer falling within the range from 1 to T:

The demultiplexer applies bit permutation to the input bits and outputs them so that the bits ($y_1$, $y_2$, ..., $y_{M1}$, $y_{B/2+1}$, $y_{B/2+2}$, ..., $y_{B/2+M1}$) are mapped to the constellation word $C_1$, the bits ($y_{M1+1}$, $y_{M1+2}$, ..., $y_{M1+M2}$, $y_{B/2+M1+1}$, $y_{B/2+M1+2}$, ..., $y_{B/2+M1+M2}$) are mapped to the constellation word $C_2$, the bits ($y_{M1+M2+1}$, $y_{M1+M2+2}$, ..., $y_{M1+M2+M3}$, $y_{B/2+M1+M2+1}$, $y_{B/2+M1+M2+2}$, ..., $y_{B/2+M1+M2+M3}$) are mapped to the constellation word $C_3$, and so on. That is, when $L_i=L_{i-1}+M_{i-1}$ (where $L_1=0$), the demultiplexer applies bit permutation to the input bits so that the bits ($y_{Li+1}$, $y_{Li+2}$, ..., $y_{Li+Mi}$, $y_{B/2+Li+1}$, $y_{B/2+Li+2}$, ..., $y_{B/2+Li+Mi}$) are mapped to the constellation word $C_i$.

<Receiver>

The following explains a receiver included in a communication system according to an embodiment of the present invention.

Figure 14:
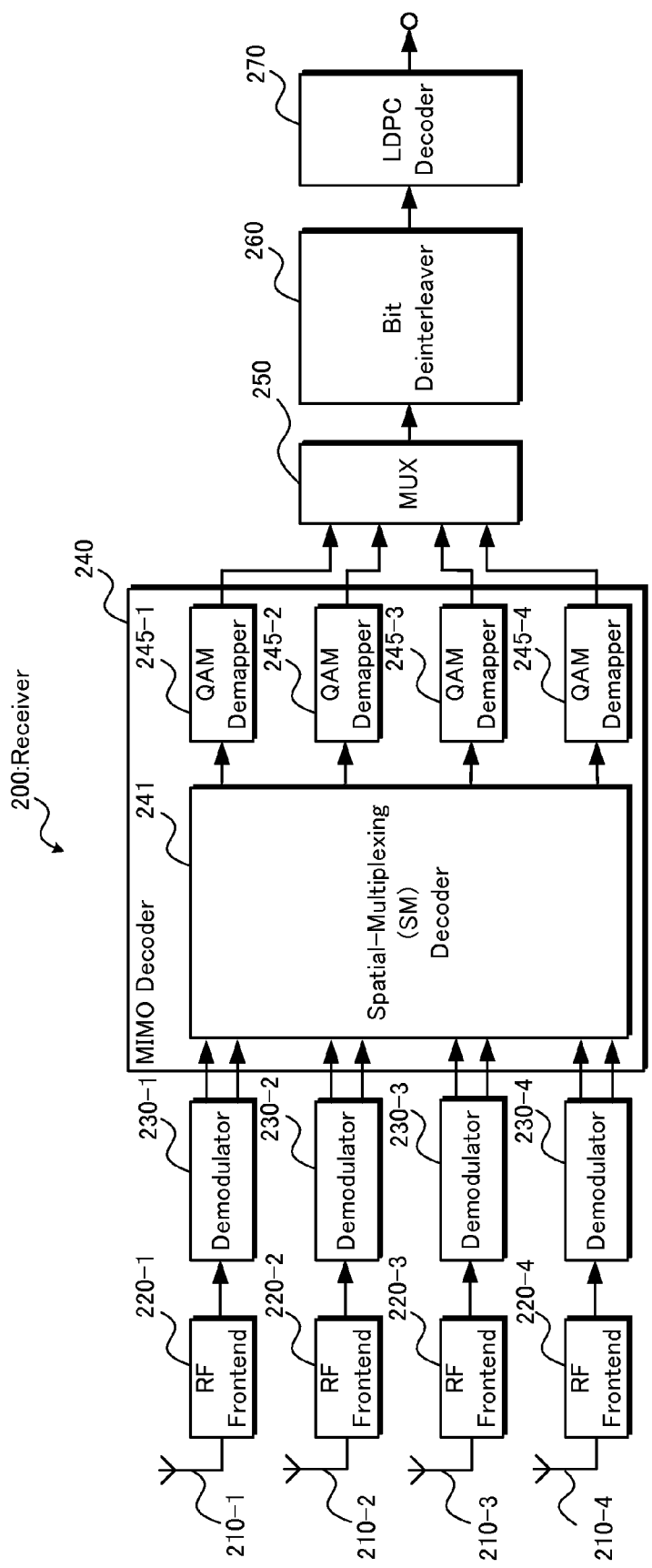
FIG. 14 is a block diagram of a receiver included in a communication system according to an embodiment of the present invention.

FIG. 14 is a block diagram of a receiver 200 according to an embodiment of the present invention. The receiver mirrors the functionality of the transmitter. A generic receiver has R receive antennas and receives the signal from the T transmit antennas. R and T are not necessarily the same.

The receiver 200 shown in FIG. 14 includes receive antennas 210-1 through 210-4, radio-frequency (RF) frontends 220-1 through 220-4, demodulators 230-1 through 230-4, a MIMO decoder 220, a multiplexer 250, a bit deinterleaver 260 and an LDPC decoder 270. The MIMO decoder 220 includes a spatial-multiplexing (SM) decoder 241 and QAM demappers 245-1 through 245-4.

The signal from each receive antenna 210-1, ..., 210-4 is processed by an RF frontend 220-1, ..., 220-4, typically comprising a tuner and a down-converter, and by a demodulator 230-1, ..., 230-4. The tuner selects a desired frequency channel, and the down-converter performs down-conversion to a desired frequency band. For each receive antenna 210-1, ..., 210-4, the demodulator 230-1, ..., 230-4 produces for each channel slot one received symbol and T channel fading coefficients. The received symbols and the associated channel fading coefficients are complex valued. For each channel slot, the R received symbols and the T*R associated channel fading coefficients are provided as input to the spatial-multiplexing SM decoder 241, which produces T complex symbols at its output. These complex symbols then undergo QAM constellation demapping, multiplexing, de-interleaving and LDPC decoding, i.e. the exact inverse steps in the transmitter as explained above in conjunction with FIGS. 8 and 9.

The QAM demappers 245-1 through 245-4 respectively perform QAM constellation demapping, corresponding to the QAM constellation mapping performed by the QAM mappers 124-1 through 124-4 included in the transmitter, on the input complex QAM symbols.

The multiplexer 250 performs, on the input from the QAM demappers 245-1 through 245-4, the inverse of the processing performed by the demultiplexer 123 included in the transmitter (i.e. processing of restoring the order of the bits before the bit permutation by the demultiplexer 123, and multiplexing the bits).

The bit deinterleaver 260 performs, on the input from the multiplexer 250, the inverse of the processing performed by the bit interleaver 122 included in the transmitter (i.e. processing of restoring the order of the bits before the bit-interleaving by the bit interleaver 122), which is called "bit deinterleaving".

The LDPC decoder 270 performs, on the input from the bit deinterleaver 260, LDPC decoding based on the same QC-LDPC codes as the LDPC encoder 121 of the transmitter.

The combination of SM decoding and QAM constellation demapping is sometimes referred in the art as multiple-input multiple-output (MIMO) decoding. In high-end implementations, a so-called maximum-likelihood decoding is employed, whereby the SM decoding and the QAM constellation demapping are performed jointly in one MIMO decoder 240. These aspects are well known in the art.

<Supplement 1>

The present invention is not limited to the particulars described as for Embodiment above. The present invention may be implemented in any modes for achieving the aim described above and other relevant or accompanying aims. For example, the following modifications may be adopted.

(1) The present invention may be applied to any number of antennas (including two, four, eight, etc.) except for one.

The present invention may also be applied to any QAM constellation, in particular to square QAM constellations (4-QAM, 16-QAM, 64-QAM, 256-QAM, etc.). Note that the value of B is the total number of the bits of the constellation to be used.

The present invention may also be applied to any LDPC code, in particular to those codes that are adopted for second-generation digital video broadcasting standards (e.g. DVB-S2, DVB-T2, DVB-C2, etc.), as they are defined, for instance, in tables A.1 through A.6 of the DVB-T2 standard ETSI EN 302.755. Note that the values of N and Q are changed depending on the LDPC code to be used.

(2) The present invention is not restricted to a particular form for implementing the disclosed methods and devices, both in software or in hardware. Specifically, the invention may be implemented in form of a computer-readable medium having embodied thereon computer-executable instructions that are adapted for allowing a computer, a microprocessor, a microcontroller, and the like, to perform all steps of a method according to the embodiments of the present invention. The present invention may also be implemented in form of an application-specific integrated circuit (ASIC) or in form of a field programmable gate array (FPGA).

<Supplement 2>

The following summarizes an interleaving method, an interleaver, a transmitter provided with the interleaver, a deinterleaving method corresponding to the interleaving method, a deinterleaver corresponding to the interleaver, and a receiver provided with the deinterleaver according to an embodiment of the present invention, and their advantageous effects.

(1) A first interleaving method is an interleaving method performed by a transmitter for a communication system with spatial multiplexing over T transmit antennas employing quasi-cyclic low-density parity-check codes, T being an integer greater than 1, the interleaving method being used for applying bit permutation to bits of a codeword of a quasi-cyclic low-density parity-check code in order to generate a plurality of constellation words of at least one spatial-multiplexing block from the codeword, the codeword consisting of N cyclic blocks, and each cyclic block consisting of Q bits, the spatial-multiplexing block consisting of B bits and consisting of T constellation words, each constellation word indicating one of a plurality of constellation points of a predefined constellation used for constellation mapping of the constellation word, the bits of each constellation word being divisible into pairs of bits having the same robustness, wherein the interleaving method comprises the step of applying the bit permutation to the bits of the codeword such that: at least one spatial-multiplexing block is made up of bits from B/2 different cyclic-blocks; each constellation word of the at least one spatial-multiplexing block is made up of bits from $B_t/2$ different cyclic blocks, $B_t$ being the number of bits of the constellation word; and each of the bit pairs of the constellation word is made up of bits from a common one of the $B_t/2$ different cyclic blocks.

A first deinterleaving method is a deinterleaving method performed by a receiver for a communication system with spatial multiplexing over T transmit antennas employing quasi-cyclic low-density parity-check codes, T being an integer greater than 1, the deinterleaving method comprising the step of applying the inverse of the bit permutation performed by the interleaving method defined in Claim 1 to at least one spatial-multiplexing block made up of a plurality of constellation words.

A first interleaver is an interleaver provided in a transmitter for a communication system with spatial multiplexing over T transmit antennas employing quasi-cyclic low-density parity-check codes, T being an integer greater than 1, the interleaver applying bit permutation to bits of a codeword of a quasi-cyclic low-density parity-check code in order to generate a plurality of constellation words of at least one spatial-multiplexing block from the codeword, the codeword consisting of N cyclic blocks, each cyclic block consisting of Q bits, the spatial-multiplexing block consisting of B bits and consisting of T constellation words, each constellation word indicating one of a plurality of constellation points of a predefined constellation used for constellation mapping of the constellation word, the bits of each constellation word being divisible into pairs of bits having the same robustness, wherein the interleaver is configured to apply the bit permutation to the bits of the codeword such that: at least one spatial-multiplexing block is made up of bits from B/2 different cyclic-blocks;

each constellation word of the at least one spatial-multiplexing block is made up of bits from $B_t/2$ different cyclic blocks, $B_t$ being the number of bits of the constellation word; and each of the bit pairs of the constellation word is made up of bits from a common one of the $B_t/2$ different cyclic blocks.

A first deinterleaver is a deinterleaver provided in a receiver for a communication system with spatial multiplexing over T transmit antennas employing quasi-cyclic low-density parity-check codes, T being an integer greater than 1, wherein the deinterleaver is configured to apply the inverse of the bit permutation performed by the interleaver defined in claim 7 to T complex symbols respectively corresponding to T constellation words of at least one spatial-multiplexing block.

A first transmitter is a transmitter for a communication system with spatial multiplexing over T transmit antennas employing quasi-cyclic low-density parity-check codes, T being an integer greater than 1, the transmitter comprising: a quasi-cyclic low-density parity-check encoder configured to generate a codeword by using a quasi-cyclic low-density parity-check code; the interleaver defined in Claim 7 configured to apply bit permutation to the bits of the codeword and to generate at least one spatial-multiplexing block; and a constellation mapper configured to map a plurality of constellation words of the at least one spatial-multiplexing block to a plurality of symbols.

A first receiver is a receiver for a communication system with spatial multiplexing over T transmit antennas employing quasi-cyclic low-density parity-check codes, T being an integer greater than 1, the receiver comprising: a multiple-input multiple-output decoder configured to convert signals from a plurality of receive antennas into T complex symbols corresponding to T constellation words of at least one spatial-multiplexing block; the deinterleaver defined in claim 12 configured to perform deinterleaving on the T complex symbols; and a quasi-cyclic low-density parity-check decoder configured to decode the T complex symbols resulting from the deinterleaving performed by the deinterleaver, by using the quasi-cyclic parity-check codes.

These methods and apparatuses improve the reception performance of a communication system.

(2) A second interleaving method is an interleaving method according to the first interleaving method, wherein when N is a multiple of B/2, the N cyclic blocks are divided into a plurality of sections each including B/2 cyclic blocks, when N is not a multiple of B/2, N-X cyclic blocks are divided into a plurality of sections each including B/2 cyclic blocks, where X is the remainder when N is divided by B/2, and the bit permutation is adapted such that the at least one spatial-multiplexing block is made up of only bits from B/2 cyclic blocks included in a same one of the sections.

A second interleaver is an interleaver according to the first interleaver, wherein when N is a multiple of B/2, the N cyclic blocks are divided into a plurality of sections each including B/2 cyclic blocks, when N is not a multiple of B/2, N-X cyclic blocks are divided into a plurality of sections each including B/2 cyclic blocks, where X is the remainder when N is divided by B/2, and the bit permutation is adapted such that the at least one spatial-multiplexing block is made up of only bits from B/2 cyclic blocks included in a same one of the sections.

These method and apparatus realize hardware or software implementation with high degree of parallelism.

(3) A third interleaving method is an interleaving method according to the second interleaving method, wherein the bit permutation is performed by applying a section permutation to the bits of each section independently of the other sections.

A third interleaver is an interleaver according to the second interleaver, wherein the bit permutation is performed by applying a section permutation to the bits of each section independently of the other sections.

These method and interleaver realize hardware or software implementation with high degree of parallelism, since they apply bit permutation to the bits of each section independently of the other sections.

(4) A fourth interleaving method is an interleaving method according to the first interleaving method, wherein in at least some of the N cyclic blocks, the bit permutation is adapted such that all Q bits of the cyclic block are mapped to bits of the same robustness.

A fourth interleaver is an interleaver according to the first interleaver, wherein in at least some of the N cyclic blocks, the bit permutation is adapted such that all Q bits of the cyclic block are mapped to bits of the same robustness.

With these method and interleaver, codeword bits with the same importance level are mapped to constellation word bits with the same robustness, and thus the importance level matches the robustness. For example, it is possible that codeword bits with the highest importance level are mapped to constellation word bits with the highest robustness, and codeword bits with the lowest importance level are mapped to constellation word bits with the lowest robustness. If this is the case, high reliability at reception of important codeword bits can be gained, and high reception performance can be achieved.

(5) A fifth interleaving method is an interleaving method according to the first leaving method, wherein the predefined constellation is a square QAM constellation.

A fifth interleaver is an interleaver according to the first interleaver, wherein the predefined constellation is a square QAM constellation.

With these method and interleaver, the square QAM constellation is divided into two PAM symbol sets of the same type that encode the same number of bits. Thus, each bit pair can be mapped to bits with the same robust level.

INDUSTRIAL APPLICABILITY

The present invention is applicable to bit-interleaved coding and modulation with LDPC codes and spatial multiplexing.

REFERENCE SIGNS LIST

100 transmitter
110 input processing
120 BICM encoder
121 LDPC encoder
122 bit interleaver
123 demultiplexer
124-1 through 124-4 QAM mapper
125 SM encoder
130-1 through 130-4 modulator
140-1 through 140-4 amplifier
150-1 through 150-4 transmit antenna
200 receiver
210-1 through 210-4 transmit antenna
220-1 through 220-4 RF frontend
230-1 through 230-4 amplifier
240 MIMO decoder
241 SM decoder 245-1 through 245-4 QAM demapper
250 multiplexer
260 bit deinterleaver
270 LDPC decoder

The invention claimed is:

1. An interleaving method performed by a transmitter for a communication system with spatial multiplexing over T transmit antennas employing quasi-cyclic low-density parity-check codes, T being an integer greater than 1, the interleaving method being used for applying bit permutation to bits of a codeword of a quasi-cyclic low-density parity-check code in order to generate a plurality of constellation words of at least one spatial-multiplexing block from the codeword, the codeword consisting of N cyclic blocks, and each cyclic block consisting of Q bits, the spatial-multiplexing block consisting of B bits and consisting of T constellation words, each constellation word indicating one of a plurality of constellation points of a predefined constellation used for constellation mapping of the constellation word, wherein the interleaving method comprises the step of applying the bit permutation to the bits of the codeword such that:

at least one spatial-multiplexing block is made up of bits from B/2 different cyclic-blocks;

each constellation word of the at least one spatial-multiplexing block is made up of bits from $B_t/2$ different cyclic blocks, $B_t$ being the number of bits of the constellation word; and each of the bit pairs of the constellation word is made up of bits from a common one of the $B_t/2$ different cyclic blocks.

2. The interleaving method of claim 1, wherein when N is a multiple of B/2, the N cyclic blocks are divided into a plurality of sections each including B/2 cyclic blocks, when N is not a multiple of B/2, N-X cyclic blocks are divided into a plurality of sections each including B/2 cyclic blocks, where X is the remainder when N is divided by B/2, and the bit permutation is adapted such that the at least one spatial-multiplexing block is made up of only bits from B/2 cyclic blocks included in a same one of the sections.

3. The interleaving method of claim 2, wherein
the bit permutation is performed by applying a section permutation to the bits of each section independently of the other sections.

4. The interleaving method of claim 1, wherein
the predefined constellation is a square QAM constellation.

5. A deinterleaving method performed by a receiver for a communication system with spatial multiplexing over T transmit antennas employing quasi-cyclic low-density parity-check codes, T being an integer greater than 1, the deinterleaving method comprising the step of applying the inverse of the bit permutation performed by the interleaving method defined in claim 1 to at least one spatial-multiplexing block made up of a plurality of constellation words.

6. An interleaver provided in a transmitter for a communication system with spatial multiplexing over T transmit antennas employing quasi-cyclic low-density parity-check codes, T being an integer greater than 1, the interleaver applying bit permutation to bits of a codeword of a quasi-cyclic low-density parity-check code in order to generate a plurality of constellation words of at least one spatial-multiplexing block from the codeword, the codeword consisting of N cyclic blocks, each cyclic block consisting of Q bits, the spatial-multiplexing block consisting of B bits and consisting of T constellation words, each constellation word indicating one of a plurality of constellation points of a predefined constellation used for constellation mapping of the constellation word, wherein the interleaver is configured to apply the bit permutation to the bits of the codeword such that:

at least one spatial-multiplexing block is made up of bits from B/2 different cyclic-blocks;

each constellation word of the at least one spatial-multiplexing block is made up of bits from $B_t/2$ different cyclic blocks, $B_t$ being the number of bits of the constellation word; and each of the bit pairs of the constellation word is made up of bits from a common one of the $B_t/2$ different cyclic blocks.

7. The interleaver of claim 6, wherein when N is a multiple of B/2, the N cyclic blocks are divided into a plurality of sections each including B/2 cyclic blocks, when N is not a multiple of B/2, N-X cyclic blocks are divided into a plurality of sections each including B/2 cyclic blocks, where X is the remainder when N is divided by B/2, and the bit permutation is adapted such that the at least one spatial-multiplexing block is made up of only bits from B/2 cyclic blocks included in a same one of the sections.

8. The interleaver of claim 7, wherein
the bit permutation is performed by applying a section permutation to the bits of each section independently of the other sections.

9. The interleaver of claim 6, wherein
the predefined constellation is a square QAM constellation.

10. A deinterleaver provided in a receiver for a communication system with spatial multiplexing over T transmit antennas employing quasi-cyclic low-density parity-check codes, T being an integer greater than 1, wherein the deinterleaver is configured to apply the inverse of the bit permutation performed by the interleaver defined in claim 6 to T complex symbols respectively corresponding to T constellation words of at least one spatial-multiplexing block.

11. A receiver for a communication system with spatial multiplexing over T transmit antennas employing quasi-cyclic low-density parity-check codes, T being an integer greater than 1, the receiver comprising:

a multiple-input multiple-output decoder configured to convert signals from a plurality of receive antennas into T complex symbols corresponding to T constellation words of at least one spatial-multiplexing block;

the interleaver defined in claim 10 configured to perform deinterleaving on the T complex symbols; and a quasi-cyclic low-density parity-check decoder configured to decode the T complex symbols resulting from the deinterleaving performed by the deinterleaver, by using the quasi-cyclic parity-check codes.

12. A transmitter for a communication system with spatial multiplexing over T transmit antennas employing quasi-cyclic low-density parity-check codes, T being an integer greater than 1, the transmitter comprising:
- a quasi-cyclic low-density parity-check encoder configured to generate a codeword by using a quasi-cyclic low-density parity-check code;
- the interleaver defined in claim 6 configured to apply bit permutation to the bits of the codeword and to generate at least one spatial-multiplexing block; and
- a constellation mapper configured to map a plurality of constellation words of the at least one spatial-multiplexing block to a plurality of symbols.

* * * * *